(12) United States Patent
Gstrein et al.

(10) Patent No.: US 11,417,567 B2
(45) Date of Patent: Aug. 16, 2022

(54) CONDUCTIVE CAP-BASED APPROACHES FOR CONDUCTIVE VIA FABRICATION AND STRUCTURES RESULTING THEREFROM

(71) Applicant: Intel Corporation, Santa Clara, CA (US)

(72) Inventors: Florian Gstrein, Portland, OR (US);
Eungnak Han, Portland, OR (US);
Rami Hourani, Portland, OR (US);
Ruth A. Brain, Portland, OR (US);
Paul A. Nyhus, Portland, OR (US);
Manish Chandhok, Beaverton, OR (US); Charles H. Wallace, Portland, OR (US); Chi-Hwa Tsang, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/347,184

(22) PCT Filed: Dec. 23, 2016

(86) PCT No.: PCT/US2016/068583
§ 371 (c)(1),
(2) Date: May 2, 2019

(87) PCT Pub. No.: WO2018/118090
PCT Pub. Date: Jun. 28, 2018

(65) Prior Publication Data
US 2019/0363008 A1    Nov. 28, 2019

(51) Int. Cl.
*H01L 21/768* (2006.01)
*H01L 21/027* (2006.01)
(Continued)

(52) U.S. Cl.
CPC .... *H01L 21/76849* (2013.01); *H01L 21/0271* (2013.01); *H01L 21/76816* (2013.01);
(Continued)

(58) Field of Classification Search
CPC ........... H01L 21/76849; H01L 21/0271; H01L 21/76816; H01L 21/76877; H01L 21/76897; H01L 23/5226; H01L 23/5283
See application file for complete search history.

(56) References Cited

U.S. PATENT DOCUMENTS

| 5,888,897 A | * | 3/1999 | Liang | ................ H01L 21/76807 257/E21.507 |
| 2014/0272711 A1 | * | 9/2014 | Bristol | .................. G03F 7/0043 430/323 |

(Continued)

FOREIGN PATENT DOCUMENTS

WO    WO 2016204772    12/2016

OTHER PUBLICATIONS

International Preliminary Report on Patentability for International Patent Application No. PCT/US2016/068583 dated Jul. 4, 2019, 10 pgs.

(Continued)

*Primary Examiner* — Peter Bradford
(74) *Attorney, Agent, or Firm* — Schwabe, Willimson & Wyatt, P.C.

(57) ABSTRACT

Conductive cap-based approaches for conductive via fabrication is described. In an example, an integrated circuit structure includes a plurality of conductive lines in an ILD layer above a substrate. Each of the conductive lines is recessed relative to an uppermost surface of the ILD layer. A plurality of conductive caps is on corresponding ones of the plurality of conductive lines, in recess regions above each of the plurality of conductive lines. A hardmask layer (Continued)

is on the plurality of conductive caps and on the uppermost surface of the ILD layer. The hardmask layer includes a first hardmask component on and aligned with the plurality of conductive caps, and a second hardmask component on an aligned with regions of the uppermost surface of the ILD layer. A conductive via is in an opening in the hardmask layer and on a conductive cap of one of the plurality of conductive lines.

23 Claims, 9 Drawing Sheets

(51) Int. Cl.
  *H01L 23/522* (2006.01)
  *H01L 23/528* (2006.01)
(52) U.S. Cl.
  CPC .. *H01L 21/76877* (2013.01); *H01L 21/76897* (2013.01); *H01L 23/5226* (2013.01); *H01L 23/5283* (2013.01)

(56) References Cited

U.S. PATENT DOCUMENTS

| | | | |
|---|---|---|---|
| 2015/0091174 A1* | 4/2015 | Clarke | H01L 21/76838 257/770 |
| 2015/0170961 A1* | 6/2015 | Romero | H01L 21/76801 438/641 |
| 2015/0243599 A1 | 8/2015 | Jezewski et al. | |
| 2015/0270224 A1 | 9/2015 | Boyanov et al. | |
| 2016/0005691 A1 | 1/2016 | Liu et al. | |
| 2016/0148869 A1 | 5/2016 | Schenker et al. | |
| 2016/0163640 A1 | 6/2016 | Edelstein et al. | |

OTHER PUBLICATIONS

International Search Report and Written Opinion for International Patent Application No. PCT/US2016/068583 dated Aug. 31, 2017, 11pgs.

Office Action from European Patent Application No. 16924501.6 dated Jun. 26, 2020, 7 pgs.

* cited by examiner ial Application No. PCT/US2016/068583, filed Dec. 23, 2016, entitled "CONDUCTIVE CAP-BASED APPROACHES FOR CONDUCTIVE VIA FABRICATION AND STRUCTURES RESULTING THEREFROM," which designates the United States of America, the entire disclosure of which is hereby incorporated by reference in its entirety and for all purposes.

CONDUCTIVE CAP-BASED APPROACHES FOR CONDUCTIVE VIA FABRICATION AND STRUCTURES RESULTING THEREFROM

CROSS-REFERENCE TO RELATED APPLICATION

This patent application is a U.S. National Phase Application under 35 U.S.C. § 371 of International Application No. PCT/US2016/068583, filed Dec. 23, 2016, entitled "CONDUCTIVE CAP-BASED APPROACHES FOR CONDUCTIVE VIA FABRICATION AND STRUCTURES RESULTING THEREFROM," which designates the United States of America, the entire disclosure of which is hereby incorporated by reference in its entirety and for all purposes.

TECHNICAL FIELD

Embodiments of the disclosure are in the field of semiconductor structures and processing and, in particular, conductive cap-based approaches for conductive via fabrication, and the resulting structures.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

Integrated circuits commonly include electrically conductive microelectronic structures, which are known in the art as vias, to electrically connect metal lines or other interconnects above the vias to metal lines or other interconnects below the vias. Vias are typically formed by a lithographic process. Representatively, a photoresist layer may be spin coated over a dielectric layer, the photoresist layer may be exposed to patterned actinic radiation through a patterned mask, and then the exposed layer may be developed in order to form an opening in the photoresist layer. Next, an opening for the via may be etched in the dielectric layer by using the opening in the photoresist layer as an etch mask. This opening is referred to as a via opening. Finally, the via opening may be filled with one or more metals or other conductive materials to form the via.

DESCRIPTION OF THE EMBODIMENTS

Figure 1A:
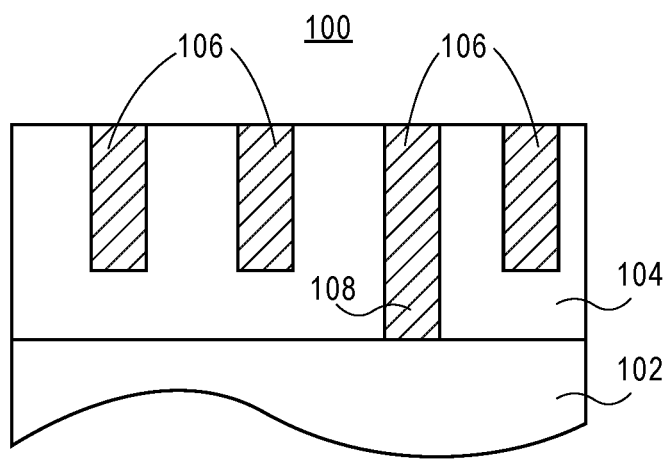
FIGS. 1A-F illustrate cross-sectional views of portions of integrated circuit layers representing various operations in a method involving conductive cap and self-aligned conductive via formation for back end of line (BEOL) interconnect fabrication, in accordance with an embodiment of the present disclosure.

In the past, the sizes and the spacing of vias has progressively decreased, and it is expected that in the future the sizes and the spacing of the vias will continue to progressively decrease, for at least some types of integrated circuits (e.g., advanced microprocessors, chipset components, graphics chips, etc.). One measure of the size of the vias is the critical dimension of the via opening. One measure of the spacing of the vias is the via pitch. Via pitch represents the center-to-center distance between the closest adjacent vias.

When patterning extremely small vias with extremely small pitches by such lithographic processes, several challenges present themselves, especially when the pitches are around 70-90 nanometers (nm) or less and/or when the critical dimensions of the via openings are around 35 nm or less. One such challenge is that the overlay between the vias and the overlying interconnects, and the overlay between the vias and the underlying landing interconnects, generally need to be controlled to high tolerances on the order of a quarter of the via pitch. As via pitches scale ever smaller over time, the overlay tolerances tend to scale with them at an even greater rate than lithographic equipment is able to keep up.

Another such challenge is that the critical dimensions of the via openings generally tend to scale faster than the resolution capabilities of the lithographic scanners. Shrink technologies exist to shrink the critical dimensions of the via openings. However, the shrink amount tends to be limited by the minimum via pitch, as well as by the ability of the shrink process to be sufficiently optical proximity correction (OPC) neutral, and to not significantly compromise line width roughness (LWR) and/or critical dimension uniformity (CDU).

Yet another such challenge is that the LWR and/or CDU characteristics of photoresists generally need to improve as the critical dimensions of the via openings decrease in order to maintain the same overall fraction of the critical dimension budget. However, currently the LWR and/or CDU characteristics of most photoresists are not improving as rapidly as the critical dimensions of the via openings are decreasing.

A further such challenge is that the extremely small via pitches generally tend to be below the resolution capabilities of even extreme ultraviolet (EUV) lithographic scanners. As a result, commonly several different lithographic masks may be used, which tend to increase the costs. At some point, if pitches continue to decrease, it may not be possible, even with multiple masks, to print via openings for these extremely small pitches using EUV scanners.

Thus, improvements are needed in the area of back end metallization manufacturing technologies for fabricating metal vias.

Conductive cap-based approaches for conductive via fabrication, and the resulting structures, are described. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

One or more embodiments described herein are directed to methods of using a conductive cap for directed self-assembly (DSA) or selective growth to enable the fabrication of self-aligned interconnects. Embodiments may address or implement one or more of the use of a conductive cap, directed self-assembly, selective deposition, self-alignment, or patterning interconnects at tight pitch. Embodiments may be implemented to provide improved via shorting margin by self-alignment with "coloring" through selective deposition, and subsequent directed self-assembly, e.g., for the 10 nm and smaller technology nodes. In one embodiment, conductive caps are implemented for pattern-replication-based via self-alignment.

To provide context, current solutions to improve shorting margin may include: (1) using metal recess to fill alternate metal trenches with different hard masks, or (2) recessing the metal or ILD to "steer" the via towards the line of interest. In accordance with an embodiment of the present disclosure, self-alignment strategies based on pattern replication of metal gratings are described. The integration of conductive caps into a pattern replication flow may provide for one or more of the following advantages: (1) Removal of the need for a conventional etch stop layer: pattern replication may be incompatible with conventional etch stop layers, as etch stop layers render the surface non-selective to subsequent pattern replication; instead, conductive caps may be implemented to retain the desired selectivity of the surface and function as an etch stop layer and an electromigration cap, (2) Improved selectivity outcomes: pattern replication by DSA or self-assembled monolayer (SAM) based selective deposition may be more facile on some metals versus others; conductive caps may be implemented to enable pattern replication on metals which otherwise are incompatible with such replication techniques, (3) Facile integration of "color" materials: color materials may be dielectric hard masks, which enable self-alignment, however, the deposition and cure of such color materials is typically not compatible with some common interconnect metals, for instance Co or Cu, which are prone to oxidation, plasma damage etc.; conductive caps may be implemented to not only protect the underlying metal against damage oxidation caused by hardmask deposition, but also to against damage caused by hardmask cure, etch and cleans where a judicious choice of the cap will not negatively impact line and via resistance.

To provide further context, local interconnect and tight-pitch metal layers may require the use of self-aligned vias. In accordance with one or more embodiments of the present disclosure, an interconnect metal is capped with a thin metal layer (conductive or metal cap). The conductive cap may improve selectivity of a pattern replication process, serve as an etch stop layer, serve as an electromigration (EM) cap, and/or protect an underlying metal layer from subsequent processing. After conductive capping, color materials may be deposited either through (i) directed self-assembly (DSA) and possible subsequent replacement of DSA with a color material, or through (ii) selective deposition of a color material itself such as a metal oxide. It is to be appreciated that state-of-the-art pattern replication methods do not use conductive caps protecting the underlying Co or Cu interconnect, resulting in significant oxidation of the interconnect metal, potential reliability fall out and/or high via resistance (e.g., due to Co damage/oxidation), where deposition of the hardmask material, cure, etch and cleans can lead to the oxidation or corrosion of the metal.

In accordance with an embodiment of the present disclosure, one or more of the above issues is addressed by implementing conductive lines having conductive protecting caps formed thereon. Such conductive caps may be beneficial for electromigration improvement and/or for corrosion or oxidation protection during process and device operation. Additionally, such conductive caps may be used as a template for selective growth or directed self-assembly. In one embodiment, such an approach may be applied to any interconnect metal layer and, possibly, to gate contacts.

More generally, one or more embodiments are directed to an approach for fabricating metal lines as well as associated conductive vias. Conductive vias or vias, by definition, are used to land on a previous layer metal pattern. In this vein, embodiments described herein enable a more robust interconnect fabrication scheme since constraints on lithography equipment is relaxed. Such an interconnect fabrication scheme can be used to save numerous alignment/exposures, and can be used to reduce total process operations and processing time otherwise required for patterning such features using conventional approaches. Other benefits may include improvements in yield, or the prevention of shorting to a wrong line.

In a first exemplary approach using conductive lines and caps of a same type as a foundation, FIGS. 1A-1F illustrate cross-sectional views of portions of integrated circuit layers representing various operations in a method involving conductive cap and self-aligned conductive via formation for back end of line (BEOL) interconnect fabrication, in accordance with an embodiment of the present disclosure.

Referring to FIG. 1A, a starting structure 100 is provided as a beginning point for fabricating a new metallization layer. The starting structure 100 includes an inter-layer dielectric (ILD) layer 104 disposed above a substrate 102. As described below, the ILD layer may be disposed above an underlying metallization layer formed above the substrate 102. Trenches are formed in the ILD layer 104 and are filled with a conductive layer or layers to provide conductive lines 106 (and, in some cases, corresponding conductive vias 108). In an embodiment, the trenches of conductive lines 106 are formed in the ILD layer 104 using a pitch division patterning process flow. Non-limiting examples of such pitch division schemes are described in greater detail below in association with FIGS. 4-6. It is to be appreciated that the following process operation described below may first involve pitch division, or may not. In either case, but particularly when pitch division is also used, embodiments may enable continued scaling of the pitch of metal layers beyond the resolution capability of state-of-the art lithography equipment.

Figure 1B:
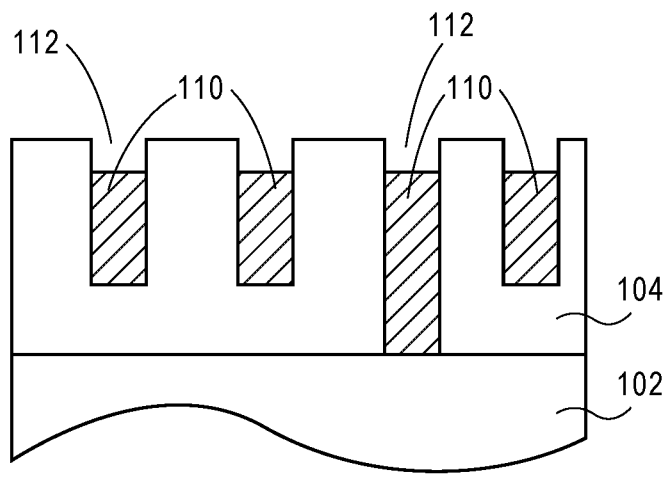

Referring to FIG. 1B, the conductive lines 106 are recessed below the upper surface of the ILD layer 104 to provide recessed conductive lines 110 having recess regions 112 above the recessed conductive lines 110. In an embodiment, the conductive lines 106 are recessed to form recessed conductive lines 110 using a selective wet etch process, such as a wet etch process based on sulfuric acid and hydrogen peroxide. In another embodiment, the conductive lines 106 are recessed to form recessed conductive lines 110 using a selective dry or plasma etch process.

Figure 1C:
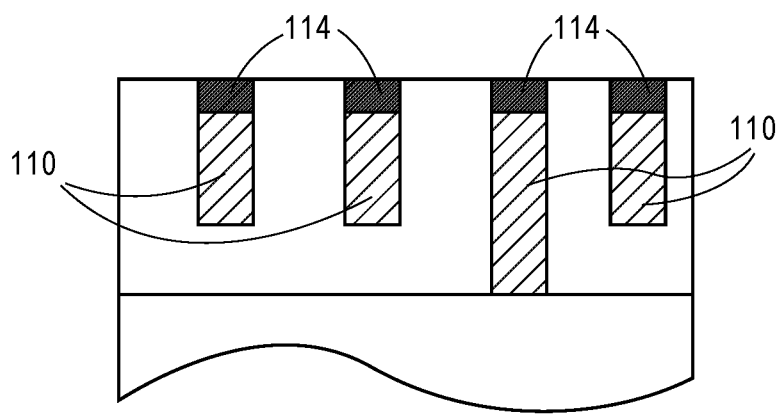

Referring to FIG. 1C, conductive caps 114 are formed in the recess regions 112 above the recessed conductive lines 110. In an embodiment, the conductive caps 114 are composed of a material that has more differentiated surface characteristics compared with the surface of ILD layer 104 than does the material of the conductive lines 106. In an embodiment, the conductive lines 106 include a copper fill material within a titanium nitride or tantalum nitride barrier liner, and the conductive caps 114 are composed of a metal such as, but not limited to, Al Pt, Ni, Ru, Pd, W, Ti, Ta, Ir, or Er, or alloys thereof. In another embodiment, Co, or an alloy of Co such as CoWB, is used. In an embodiment, at least a portion (e.g., a copper fill) of the conductive lines 106 is formed using electroplating process, and the conductive caps 114 are formed using a chemical vapor deposition (CVD) process, an atomic layer deposition (ALD) process, a physical vapor deposition (PVD) process, an e-beam evaporation process, an electroplating process, an electroless deposition process, or a spin-on process. In any case, in an embodiment, following deposition, the material of the conductive caps 114 is planarized, e.g., using chemical mechanical polishing (CMP), resulting in conductive caps 114 that are substantially co-planar with an uppermost surface of the ILD layer 104, as is depicted in FIG. 1C. As described herein, in an embodiment, metal cap formation is based on a recess, fill, CMP process. In another embodiment, cap deposition is achieved through selective deposition (e.g., in either recessed or non-recessed profiles). In another embodiment, cap formation is achieved through selective deposition.

It is to be appreciated that, aside from protecting the metal of recessed conductive lines 110 in subsequent processing steps, the conductive cap material may also aid the selective deposition of hardmask materials, particularly "color" hardmask materials. For example, Ru and W have been demonstrated to provide for an improved DSA brush grafting density as compared with cobalt. Furthermore, selective metal oxide deposition on Co with self-assembled monolayers (SAMs) may be challenging because of the tendency of cobalt to oxidize. In an embodiment, conductive caps 114 provide hermeticity during processing and reliability benefits in lieu of a conventional etch stop layer, in addition to facilitating pattern replication, as described below.

Figure 1D:
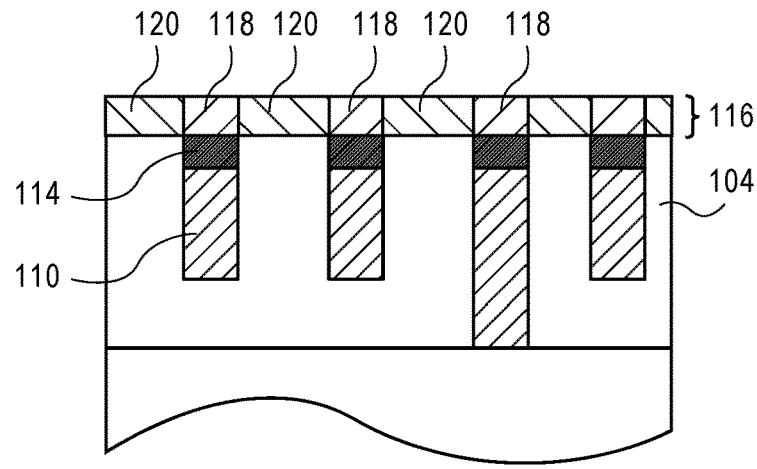

Referring to FIG. 1D, a hardmask layer 116 is formed over the structure of FIG. 1C. The hardmask layer 116 includes a first hardmask component 118 and a second hardmask component 120. The first hardmask component is formed on and in alignment with the conductive caps 114. The second hardmask component 120 is formed on and aligned with exposed surfaces of the ILD layer 104. In an embodiment, the hardmask layer 116 having first hardmask component 118 and second hardmask component 120 is formed using a directed self-assembly or selective deposition approach to ultimately form the two different, alternating regions of first hardmask component 118 and second hardmask component 120. In one such embodiment, the directed self-assembly or selective deposition approach is enhanced by the use of conductive caps 114 as opposed to using the surfaces of the conductive lines 106. In an embodiment, the materials of the first hardmask component 118 and second hardmask component 120 exhibit differing etch selectivity to one another. As described in greater detail below, directed self-assembly or selective growth can be used to align the first hardmask component 118 and second hardmask component 120 selectively to dielectric and metal surfaces, respectively.

In a first general embodiment, in order to ultimately form first hardmask component 118 and second hardmask component 120, a direct self-assembly (DSA) block co-polymer deposition and polymer assembly process is performed. In an embodiment, a DSA block co-polymer is coated on the surface and annealed to segregate the polymer into first blocks and second blocks. In one embodiment, the first polymer blocks preferentially attaches to the exposed surfaces of the ILD layer 104. The second polymer blocks adhere to the conductive caps 114.

In an embodiment, the block copolymer molecule is a polymeric molecule formed of a chain of covalently bonded monomers. In a di-block copolymer, there are two different types of monomers, and these different types of monomers are primarily included within two different blocks or contiguous sequences of monomers. The illustrated block copolymer molecule includes a block of first polymer and a block of second polymer. In an embodiment, the block of first polymer includes predominantly a chain of covalently linked monomer A (e.g., A-A-A-A-A . . . ), whereas the block of second polymer includes predominantly a chain of covalently linked monomer B (e.g., B-B-B-B-B . . . ). The monomers A and B may represent any of the different types of monomers used in block copolymers known in the arts. By way of example, the monomer A may represent monomers to form polystyrene, and the monomer B may represent monomers to form poly(methyl methacrylate) (PMMA), or vice versa, although the scope of the disclosure is not so limited. In other embodiments, there may be more than two blocks. Moreover, in other embodiments, each of the blocks may include different types of monomers (e.g., each block may itself be a copolymer). In one embodiment, the block of first polymer and the block of second polymer are covalently bonded together. The block of first polymer and the block of second polymer may be of approximately equal length, or one block may be significantly longer than the other.

In an embodiment, as described in greater detail below, phase segregation of block copolymers is implemented. In one such embodiment, DSA brushes (such as small polystyrene or PMMA fragments of controlled molecular weight with thiol or nitrile or OH terminal groups) are formed first on the surface to facilitate such phase separation. In a particular such embodiment, such a brush layer attaches covalently to a metal or ILD surface and then guides the block copolymers to assemble over the metal and ILD grating.

Typically, the blocks of block copolymers (e.g., the block of first polymer and the block of second polymer may each have different chemical properties. As one example, one of the blocks may be relatively more hydrophobic (e.g., water repelling) and the other may be relatively more hydrophilic (water attracting). At least conceptually, one of the blocks may be relatively more similar to oil and the other block may be relatively more similar to water. Such differences in chemical properties between the different blocks of polymers, whether a hydrophilic-hydrophobic difference or otherwise, may cause the block copolymer molecules to self-assemble. For example, the self-assembly may be based on microphase separation of the polymer blocks. Conceptually, this may be similar to the phase separation of oil and water which are generally immiscible. Similarly, differences in hydrophilicity between the polymer blocks (e.g., one block is relatively hydrophobic and the other block is relatively hydrophilic), may cause a roughly analogous microphase separation where the different polymer blocks try to "separate" from each other due to chemical dislike for the other.

However, in an embodiment, since the polymer blocks are covalently bonded to one another, they cannot completely separate on a macroscopic scale. Rather, polymer blocks of a given type may tend to segregate or conglomerate with polymer blocks of the same type of other molecules in extremely small (e.g., nano-sized) regions or phases. The particular size and shape of the regions or microphases generally depends at least in part upon the relative lengths of the polymer blocks. In an embodiment, by way of example, in two block copolymers, if the blocks are approximately the same length, a grid like pattern of alternating first polymer lines and second polymer lines is generated.

In an embodiment, the first polymer/second polymer grating is first applied as an unassembled block copolymer layer portion that includes a block copolymer material applied, e.g., by brush or other coating process. The unassembled aspect refers to scenarios where, at the time of deposition, the block copolymer has not yet substantially phase separated and/or self-assembled to form nanostructures. In this unassembled form, the block polymer molecules are relatively highly randomized, with the different polymer blocks relatively highly randomly oriented and located. The unassembled block copolymer layer portion may be applied in a variety of different ways. By way of example, the block copolymer may be dissolved in a solvent and then spin coated over the surface. Alternatively, the unassembled block copolymer may be spray coated, dip coated, immersion coated, or otherwise coated or applied over the surface. Other ways of applying block copolymers, as well as other ways known in the arts for applying similar organic coatings, may potentially be used. Then, the unassembled layer may form an assembled block copolymer layer portion, e.g., by microphase separation and/or self-assembly of the unassembled block copolymer layer portion. The microphase separation and/or self-assembly occurs through rearrangement and/or repositioning of the block copolymer molecules, and in particular to rearrangement and/or repositioning of the different polymer blocks of the block copolymer molecules.

In one such embodiment, an annealing treatment may be applied to the unassembled block copolymer in order to initiate, accelerate, increase the quality of, or otherwise promote microphase separation and/or self-assembly. In some embodiments, the annealing treatment may include a treatment that is operable to increase a temperature of the block copolymer. One example of such a treatment is baking the layer, heating the layer in an oven or under a thermal lamp, applying infrared radiation to the layer, or otherwise applying heat to or increasing the temperature of the layer. The desired temperature increase will generally be sufficient to significantly accelerate the rate of microphase separation and/or self-assembly of the block polymer without damaging the block copolymer or any other important materials or structures of the integrated circuit substrate. Commonly, the heating may range between about 50° C. to about 300° C., or between about 75° C. to about 250° C., but not exceeding thermal degradation limits of the block copolymer or integrated circuit substrate. The heating or annealing may help to provide energy to the block copolymer molecules to make them more mobile/flexible in order to increase the rate of the microphase separation and/or improve the quality of the microphase separation. Such microphase separation or rearrangement/repositioning of the block copolymer molecules may lead to self-assembly to form extremely small (e.g., nano-scale) structures. The self-assembly may occur under the influence of surface energy, molecular affinities, and other surface-related and chemical-related forces.

In any case, in some embodiments, self-assembly of block copolymers, whether based on hydrophobic-hydrophilic differences or otherwise, may be used to form extremely small periodic structures (e.g., precisely spaced nano-scale structures or lines). In some embodiments, they may be used to form nano-scale lines or other nano-scale structures.

Referring again to FIG. 1D, in the case of a DSA process, in a first embodiment, the first hardmask component 118 and second hardmask component 120 are the second and first block polymers, respectively. In a second embodiment, however, the second and first block polymers are each sequentially replaced with the materials of the first hardmask component 118 and second hardmask component 120, respectively. In one such embodiment, selective etching and deposition process are used to replace the second and first block polymers with the materials of the first hardmask component 118 and second hardmask component 120, respectively.

In a second general embodiment, in order to ultimately form first hardmask component 118 and second hardmask component 120, a selective growth process is instead of a DSA approach. In one such embodiment, the material of the second hardmask component 120 is grown above exposed portions of the ILD layer 104. A second, different, material of the first hardmask component 118 is grown above the conductive caps 114. In an embodiment, the selective growth is achieved by a dep-etch-dep-etch approach for both of the materials of the first hardmask component 118 and second hardmask component 120, resulting in a plurality of layers of each of the materials. Such an approach may be favorable versus conventional selective growth techniques which can form "mushroom-top" shaped films. The mushroom topping film growth tendency can be reduced through an alternating deposition/etch/deposition (dep-etch-dep-etch) approach. In another embodiment, a film is deposited selectively over the metal followed by a different film selectively over the ILD (or vice versa) and repeated numerous times creating a sandwich-like stack. In another embodiment, both materials are grown simultaneously in a reaction chamber (e.g., by a CVD style process) that grows selectively on each exposed region of the underlying substrate.

As described in greater detail below, in an embodiment, the resulting structure of FIG. 1D enables improved via shorting margins when fabricating later via layers on the structure of FIG. 1D. In one embodiment, improved shorting margin is achieved since fabricating a structure with alternating "color" hardmask components reduces the risk of a via shorting to the wrong metal line. In one embodiment, self-alignment is achieved since the alternating color hardmask components are self-aligned to the alternating ILD layer 104 and conductive cap 114 surfaces beneath. In a particular embodiment, the first hardmask component 118 and second hardmask component 120 are different ones of materials such as, but not limited to, $SiO_2$, Al-doped $SiO_2$, SiN, SiC, SiCN, SiCON, or metal oxides (such as AlOx, HfOx, ZrOx, TiOx).

Figure 1E:
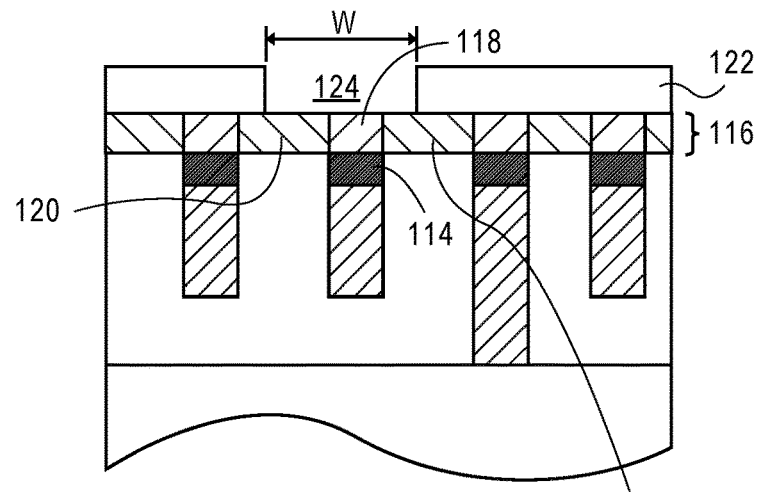

Referring to FIG. 1E, a second inter-layer dielectric (ILD) layer 122 is formed above the structure of FIG. 1D. An opening 124 is formed in the second ILD layer 122. In an embodiment, the opening 124 is formed in a location selected for conductive via fabrication for a next level metallization layer. In contrast to conventional via location selection, the opening 124 can, in one embodiment, have a relatively relaxed width as compared to the width of the corresponding conductive line 106 onto which the conductive via will ultimately be formed. For example, in a particular embodiment, the width (W) of the opening 124 has a dimension of approximately ¾ pitch of the conductive lines 106. Such an accommodation for a relatively wider via opening 124 can relax constraints on the lithography process used to form the opening 124. Additionally, tolerance for mis-alignment may be increased as well.

Figure 1F:
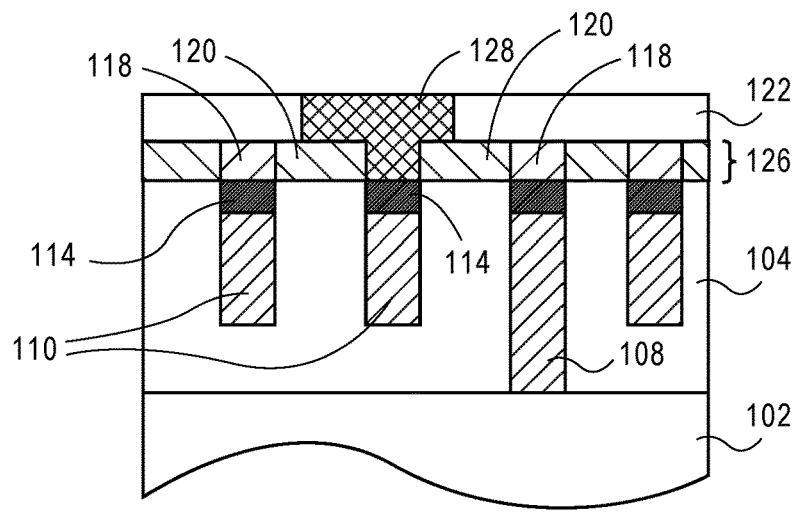

FIG. 1F illustrates the structure of FIG. 1E following next layer via fabrication. One of the first hardmask components 118 is selected for removal, e.g., by a selective etch process. In this case, the exposed one of the first hardmask components 118 is removed selective to exposed portions of the second hardmask components 120. In an embodiment, the exposed one of the first hardmask components 118 is removed selective to exposed portions of the second hardmask components 120 using a selective wet etch process. In another embodiment, the exposed one of the first hardmask components 118 is removed selective to exposed portions of the second hardmask components 120 using a selective dry or plasma etch process.

A conductive via 128 is then formed in the opening 124 and in the region where the selected one of the first hardmask components 118 has been removed. The conductive via 128 electrically contacts a corresponding one of the conductive caps 114 of the recessed conductive lines 110. In an embodiment, the conductive via 128 electrically contacts the corresponding one of the conductive caps 114 of the recessed conductive lines 110 without shorting to one of the adjacent or neighboring conductive caps 114/recessed conductive line 110 pairings. In a specific embodiment, a portion of the conductive via 128 is disposed on one or more exposed portions of the second hardmask components 120, as is depicted in FIG. 1F. In an embodiment, an improved shorting margin is realized.

Referring again to FIG. 1F, in an exemplary illustrative embodiment, an integrated circuit structure includes a plurality of conductive lines 110 in an inter-layer dielectric (ILD) layer 104 above a substrate 102. Each of the plurality of conductive lines 110 is recessed relative to an uppermost surface of the ILD layer 104. A plurality of conductive caps 114 is on corresponding ones of the plurality of conductive lines 110, in recess regions above each of the plurality of conductive lines 110. A hardmask layer 126 is on the plurality of conductive caps 114 and on the uppermost surface of the ILD layer 104. The hardmask layer 126 includes a first hardmask component 118 on and aligned with the plurality of conductive caps 114. A second hardmask component 120 of the hardmask layer 126 is on an aligned with regions of the uppermost surface of the ILD layer 104. The first 118 and second 120 hardmask components differ in composition from one another. A conductive via 128 is in an opening in the hardmask layer 126 and on a conductive cap 114 of one of the plurality of conductive lines 110. A portion of the conductive via 128 is on a portion of the second hardmask component 120 of the hardmask layer 126.

In an embodiment, the plurality of conductive caps 114 has an uppermost surface substantially co-planar with the uppermost surface of the ILD layer 104, as is depicted in FIG. 1F. In an embodiment, the first hardmask component 118 has an uppermost surface substantially co-planar with an uppermost surface of the second hardmask component 120, as is depicted in FIG. 1F. In an embodiment, the integrated circuit structure further includes a second ILD layer 122 above the hardmask layer 126. The conductive via 128 is further in an opening of the second ILD layer 122. In one such embodiment, the opening of the second ILD layer has a width approximately equal to ¾ pitch of the plurality of conductive lines 110. In an embodiment, one of the plurality of conductive lines 110 is coupled to an underlying conductive via structure 108, as is depicted in FIG. 1F. In one such embodiment, the underlying conductive via structure 108 is connected to an underlying metallization layer of the integrated circuit structure (not depicted).

Figure 2A:
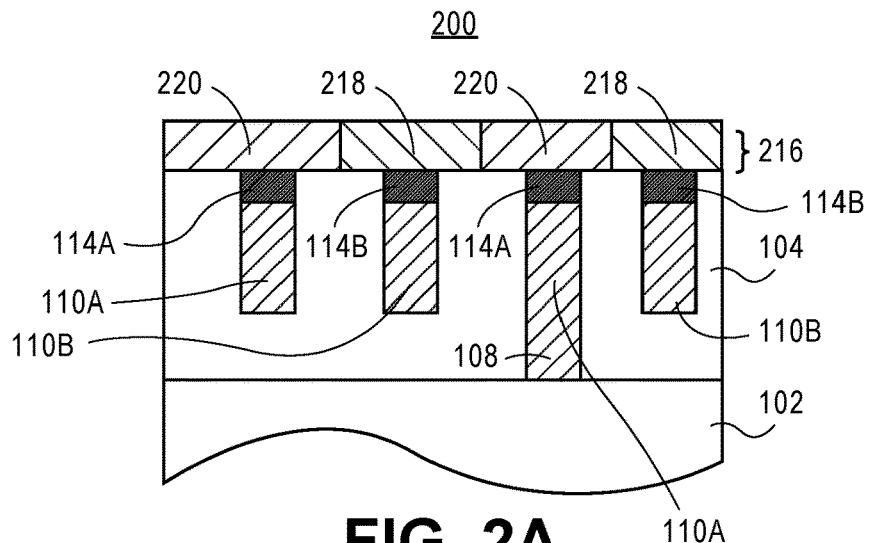
FIGS. 2A-2C illustrate cross-sectional views of portions of integrated circuit layers representing various operations in another method involving conductive cap and self-aligned conductive via formation for back end of line (BEOL) interconnect fabrication, in accordance with another embodiment of the present disclosure.
Figure 2B:
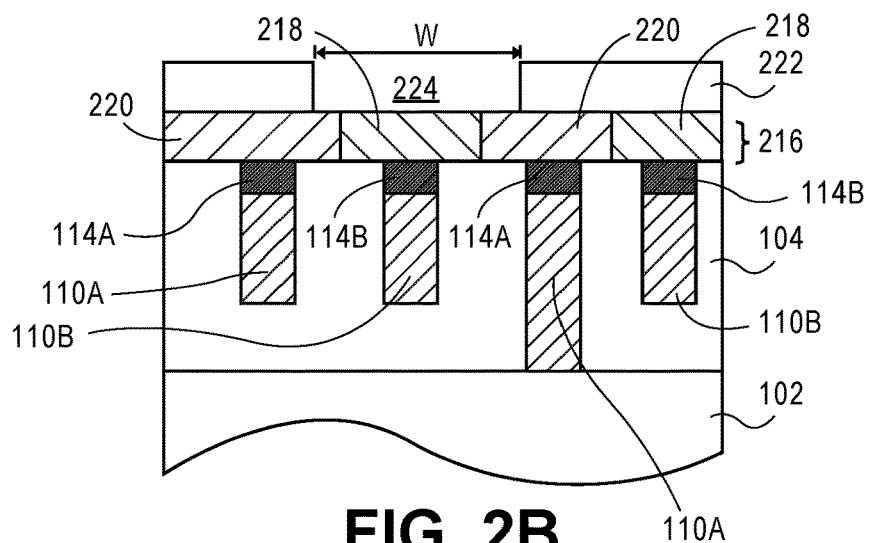
Figure 2C:
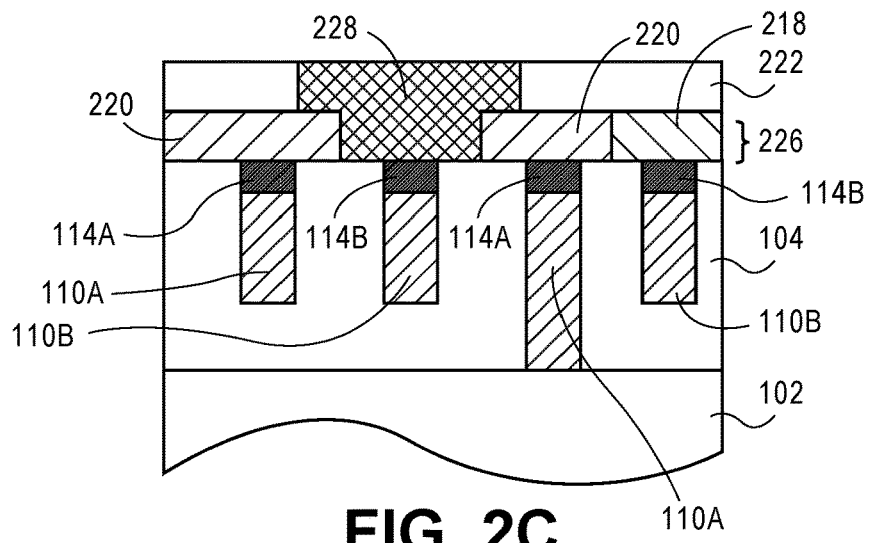

In a second exemplary approach using different "color" conductive caps as a foundation, FIGS. 2A-2C illustrate cross-sectional views of portions of integrated circuit layers representing various operations in another method involving conductive cap and self-aligned conductive via formation for back end of line (BEOL) interconnect fabrication, in accordance with another embodiment of the present disclosure.

Referring to FIG. 2A, a starting structure 200 includes a plurality of alternating first 110A and second 110B conductive lines is formed in an inter-layer dielectric (ILD) layer 104 above a substrate 102. The plurality of alternating first 110A and second 110B conductive lines is recessed relative to an uppermost surface of the ILD layer 104. Subsequent to the recessing, a plurality of first conductive caps 114A is formed on corresponding ones of the first conductive lines 110A in recess regions above each of the first conductive lines 110A. A plurality of second conductive caps 114B is formed on corresponding ones of the second conductive lines 110B in recess regions above each of the second conductive lines 110B. In one embodiment, the plurality of second conductive caps 114B differs in composition from the plurality of first conductive caps 114A. A hardmask layer 216 is formed on the plurality of first conductive caps 114A, on the plurality of second conductive caps 114B and on the uppermost surface of the ILD layer 104. The hardmask layer 216 includes a first hardmask component 220 on and aligned with the plurality of first conductive caps 114A, and a second hardmask component 218 on an aligned with the plurality of second conductive caps 114B. In one embodiment, the first 220 and second 218 hardmask components differ in composition from one another.

In an embodiment, the starting structure 200 is fabricated by patterning a hardmask and ILD layer and then metallizing half of a population of metal trenches (e.g., alternating one of the trenches), leaving the other half of the population open until a subsequent metallization process is performed on the other half of the population. Such an approach allows for the possibility of differing composition of alternating lines. For example, in one embodiment, a metallization layer ultimately includes conductive interconnects of alternating, differing first and second compositions. In another embodiment, however, the metal lines 110A and 110B are fabricated from substantially the same material.

In an embodiment, in order to achieve differing composition of alternating conductive caps 114A and 114B, two separate recess and fill process are used to fabricate first 114A and second 114B conductive cap types. In an embodiment, the hardmask layer 216 having first hardmask component 220 and second hardmask component 218 is formed using a directed self-assembly or selective deposition approach to ultimately form the two different, alternating regions of first hardmask component 220 and second hardmask component 218. In one such embodiment, the directed self-assembly or selective deposition approach is enhanced by the use of conductive caps 114A and 114B as opposed to using the surfaces of the corresponding conductive lines 110A and 110B, respectively. In an embodiment, the materials of the first hardmask component 220 and second hardmask component 218 exhibit differing etch selectivity to one another. Directed self-assembly or selective growth can be used to align the first hardmask component 220 and second hardmask component 218 selectively to the respective materials of first conductive caps 114A and second conductive caps 114B.

Referring to FIG. 2B, a second inter-layer dielectric (ILD) layer 222 is formed above the structure of FIG. 2A. An opening 224 is formed in the second ILD layer 222. In an embodiment, the opening 224 is formed in a location selected for conductive via fabrication for a next level metallization layer. In contrast to conventional via location selection, the opening 224 can, in one embodiment, have a relatively relaxed width as compared to the width of the corresponding conductive line 110B onto which the conductive via will ultimately be formed. For example, in a particular embodiment, the width (W) of the opening 224 has a dimension of approximately 1.5 times the pitch of the conductive lines 110A/110B. Such an accommodation for a relatively wider via opening 224 can relax constraints on the lithography process used to form the opening 224. Additionally, tolerance for mis-alignment may be increased as well.

FIG. 2C illustrates the structure of FIG. 2B following next layer via fabrication. One of the second hardmask components 218 is selected for removal, e.g., by a selective etch process. In this case, the exposed one of the second hardmask components 218 is removed selective to exposed portions of the first hardmask components 220. In an embodiment, the exposed one of the second hardmask components 218 is removed selective to exposed portions of the first hardmask components 220 using a selective wet etch process. In another embodiment, the exposed one of the second hardmask components 218 is removed selective to exposed portions of the first hardmask components 220 using a selective dry or plasma etch process.

A conductive via 228 is then formed in the opening 224 and in the region where the selected one of the second hardmask components 218 has been removed. The conductive via 228 electrically contacts a corresponding one of the second conductive caps 114B of one of the recessed second conductive lines 110B. In an embodiment, the conductive via 228 electrically contacts the corresponding one of the second conductive caps 114B of the recessed second conductive lines 110B without shorting to one of the adjacent or neighboring first conductive caps 114A/recessed first conductive line 110A pairings. In a specific embodiment, a portion of the conductive via 228 is disposed on one or more exposed portions of the first hardmask components 220, as is depicted in FIG. 2C. In an embodiment, then, an improved shorting margin is realized.

Referring again to FIG. 2C, in an exemplary illustrative embodiment, an integrated circuit structure includes a plurality of alternating first 110A and second 110B conductive lines in an inter-layer dielectric (ILD) layer 104 above a substrate 102. In one embodiment, as described below in association with FIG. 3, the plurality of alternating first 110A and second 110B conductive lines is formed along a same direction of a back end of line (BEOL) metallization layer. Each of the plurality of alternating first 110A and second 110B conductive lines is recessed relative to an uppermost surface of the ILD layer 104. A plurality of first conductive caps 114A is on corresponding ones of the first conductive lines 110A, in recess regions above each of the first conductive lines 110A. A plurality of second conductive caps 114B is on corresponding ones of the second conductive lines 110B, in recess regions above each of the second conductive lines 110B. The plurality of second conductive caps 114B differs in composition from the plurality of first conductive caps 114A. A hardmask layer 226 is on the plurality of first conductive caps 114A, on the plurality of second conductive caps 114B and on the uppermost surface of the ILD layer 104. The hardmask layer 226 includes a first hardmask 220 component on and aligned with the plurality of first conductive caps 114A, and a second hardmask component 218 on an aligned with the plurality of second conductive caps 114B. The first 220 and second 218 hardmask components differ in composition from one another. A conductive via 228 is in an opening in the hardmask layer 226 and on a second conductive cap 114B of one of the second conductive lines 110B. In an embodiment, a portion of the conductive via 228 is on a portion of the first hardmask component 220 of the hardmask layer 226, as is depicted in FIG. 2C.

In an embodiment, the plurality of first conductive caps 114A and the plurality of second conductive caps 114B have an uppermost surface substantially co-planar with the uppermost surface of the ILD layer 104, as is depicted in FIG. 2C. In an embodiment, the first hardmask component 220 has an uppermost surface substantially co-planar with an uppermost surface of the second hardmask component 218, as is depicted in FIG. 2C. In an embodiment, the integrated circuit further includes a second ILD layer 222 above the hardmask layer 226. The conductive via 228 is further in an opening of the second ILD layer 222. In one such embodiment, the opening of the second ILD layer 222 has a width approximately equal to 1.5 pitch of the plurality of alternating first and second conductive lines 110A/110B. In an embodiment, one of the plurality of alternating first and second conductive lines 110A/110B is coupled to an underlying conductive via structure 108, as is labeled in FIG. 2A. In one such embodiment, the underlying conductive via structure is connected to an underlying metallization layer of the integrated circuit structure (not shown).

In an embodiment, a total composition of the first conductive lines 110A is the same as a total composition of the second conductive lines 110B. In an embodiment, a total composition of the first conductive lines 110A is different than a total composition of the second conductive lines 110B.

A resulting structure such as described in association with FIG. 1F or 2C may subsequently be used as a foundation for forming subsequent metal line/via and ILD layers. Alternatively, the structures of FIG. 1F or 2C may represent the final metal interconnect layer in an integrated circuit. It is to be appreciated that the above process operations may be practiced in alternative sequences, not every operation need be performed and/or additional process operations may be performed. Although the above methods (e.g., FIGS. 1A-1F or 2A-2C) of fabricating a metallization layer of a BEOL metallization layer have been described in detail with respect to select operations, it is to be appreciated that additional or intermediate operations for fabrication may include standard microelectronic fabrication processes such as lithography, etch, thin films deposition, planarization (such as chemical mechanical polishing (CMP)), diffusion, metrology, the use of sacrificial layers, the use of etch stop layers, the use of planarization stop layers, and/or any other associated action with microelectronic component fabrication.

Figure 3:
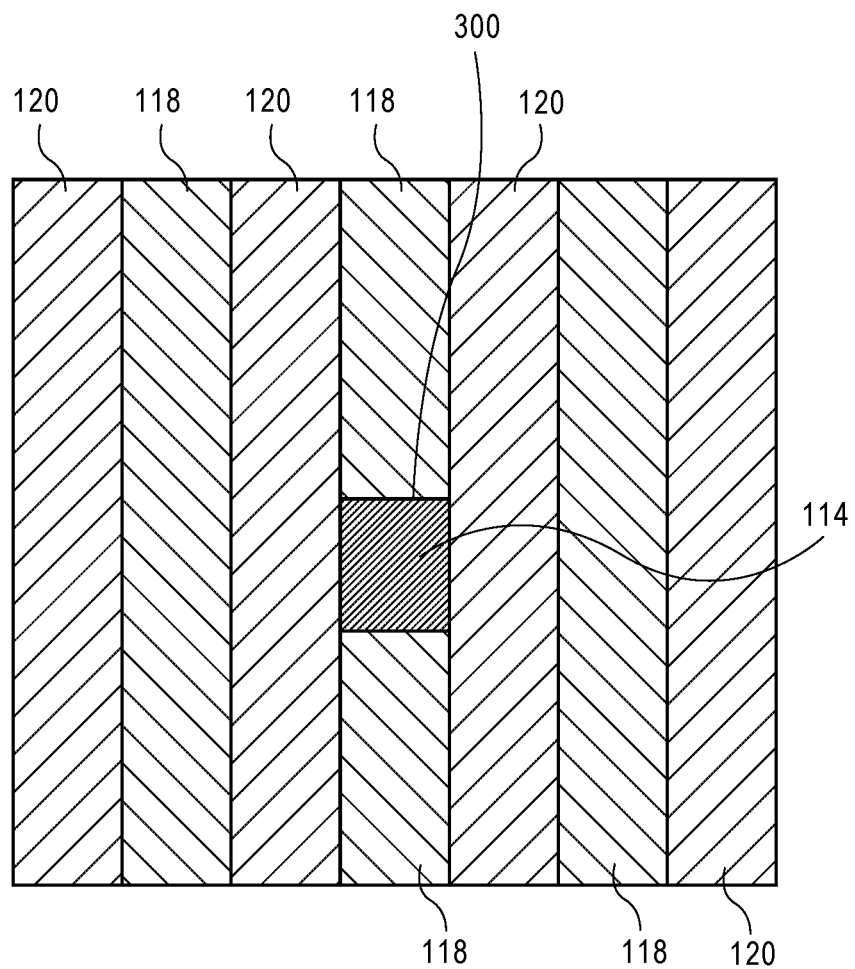
FIG. 3 illustrates a plan view of a portion of an integrated circuit layer representing an operation in a method involving conductive cap and self-aligned conductive via formation for back end of line (BEOL) interconnect fabrication, in accordance with an embodiment of the present disclosure.

FIG. 3 illustrates a plan view of a portion of an integrated circuit layer representing an operation in a method involving conductive cap and self-aligned conductive via formation for back end of line (BEOL) interconnect fabrication, in accordance with an embodiment of the present disclosure.

Referring to FIG. 3, first 118 and second 120 hardmask components are shown in this view. An opening 300 in one of the first 118 hardmask components is shown revealing a portion of an underlying conductive cap 114. It is to be appreciated that the opening 300 may be representative of openings for conductive vias 128 or 228 of FIG. 1F or 2C, respectively. Accordingly, in an embodiment, selective removal of one of the hardmask components over a selected line does not reveal the entire underlying line, but rather only a portion of the line where via formation is to occur. In an embodiment, only portions of the one of the first 118 hardmask components exposed by an opening such as opening 124 or opening 224 is removed along the one of the lines. It is further to be appreciated that FIG. 3 is representative of an embodiment, where the plurality of conductive lines 106/110 (FIGS. 1A-1F) is formed along a same direction of a back end of line (BEOL) metallization layer, or where the plurality of alternating first 110A and second 110B conductive lines (FIGS. 2A-2C) is formed along a same direction of a back end of line (BEOL) metallization layer.

Embodiments described above may be implemented to enables strong self-alignment and mitigation of edge placement issues that otherwise plague conventional patterning. Embodiments may be implemented to enable integration of DSA and selective deposition. Embodiments may be implemented to enable robust interconnect reliability and low via/contact resistance.

In an embodiment, as used throughout the present description, an interlayer dielectric (ILD) material is composed of or includes a layer of a dielectric or insulating material. Examples of suitable dielectric materials include, but are not limited to, oxides of silicon (e.g., silicon dioxide ($SiO_2$)), nitrides of silicon (e.g., silicon nitride ($Si_3N_4$)), doped oxides of silicon, fluorinated oxides of silicon, carbon doped oxides of silicon, various low-k dielectric materials known in the arts, and combinations thereof. The interlayer dielectric material may be formed by conventional techniques, such as, for example, chemical vapor deposition (CVD), physical vapor deposition (PVD), or by other deposition methods.

In an embodiment, as is also used throughout the present description, metal lines or interconnect line material (and via material) is composed of one or more metal or other conductive structures. A common example is the use of copper lines and structures that may or may not include barrier layers between the copper and surrounding ILD material. As used herein, the term metal includes alloys, stacks, and other combinations of multiple metals. For example, the metal interconnect lines may include barrier layers, stacks of different metals or alloys, etc. Thus, the interconnect lines may be a single material layer, or may be formed from several layers, including conductive liner layers and fill layers. Any suitable deposition process, such as electroplating, chemical vapor deposition or physical vapor deposition, may be used to form interconnect lines. In an embodiment, the interconnect lines are composed of a barrier layer and a conductive fill material. In one embodiment, the barrier layer is a tantalum or tantalum nitride layer, or a combination thereof. In one embodiment, the conductive fill material is a material such as, but not limited to, Cu, Al, Ti, Zr, Hf, V, Ru, Co, Ni, Pd, Pt, W, Ag, Au or alloys thereof. The interconnect lines are also sometimes referred to in the art as traces, wires, lines, metal, metal lines, or simply interconnect.

In an embodiment, as is also used throughout the present description, hardmask materials (and in some instances etch stop layers) are composed of dielectric materials different from the interlayer dielectric material. In one embodiment, different hardmask materials may be used in different regions so as to provide different growth or etch selectivity to each other and to the underlying dielectric and metal layers. In some embodiments, a hardmask layer includes a layer of a nitride of silicon (e.g., silicon nitride) or a layer of an oxide of silicon, or both, or a combination thereof. Other suitable materials may include carbon-based materials, such as silicon carbide. In another embodiment, a hardmask material includes a metal species. For example, a hardmask or other overlying material may include a layer of a nitride of titanium or another metal (e.g., titanium nitride). Potentially lesser amounts of other materials, such as oxygen, may be included in one or more of these layers. Alternatively, other hardmask layers known in the art may be used depending upon the particular implementation. The hardmask layers may be formed by CVD, PVD, or by other deposition methods.

It is to be appreciated that the layers and materials described in association with FIGS. 1A-1F, 2A-2C, and 3 are typically formed on or above an underlying semiconductor substrate or structure, such as underlying device layer(s) of an integrated circuit. In an embodiment, an underlying semiconductor substrate represents a general workpiece object used to manufacture integrated circuits. The semiconductor substrate often includes a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials. The semiconductor substrate, depending on the stage of manufacture, often includes transistors, integrated circuitry, and the like. The substrate may also include semiconductor materials, metals, dielectrics, dopants, and other materials commonly found in semiconductor substrates. Furthermore, the structure depicted in FIG. 1F or 2C (i.e., as starting from FIG. 1A or 2A, respectively) may be fabricated on underlying lower level interconnect layers.

As described above, patterned features may be patterned in a grating-like pattern with lines, holes or trenches spaced at a constant pitch and having a constant width. The pattern, for example, may be fabricated by a pitch halving or pitch quartering approach. In an example, a blanket film (such as a polycrystalline silicon film) is patterned using lithography and etch processing which may involve, e.g., spacer-based-quadruple-patterning (SBQP) or pitch quartering. It is to be appreciated that a grating pattern of lines can be fabricated by numerous methods, including 193 nm immersion lithography (i193), extreme ultra-violet (EUV) and/or electron-beam direct write (EBDW) lithography, directed self-assembly, etc. In other embodiments, the pitch does not need to be constant, nor does the width.

Figure 4:
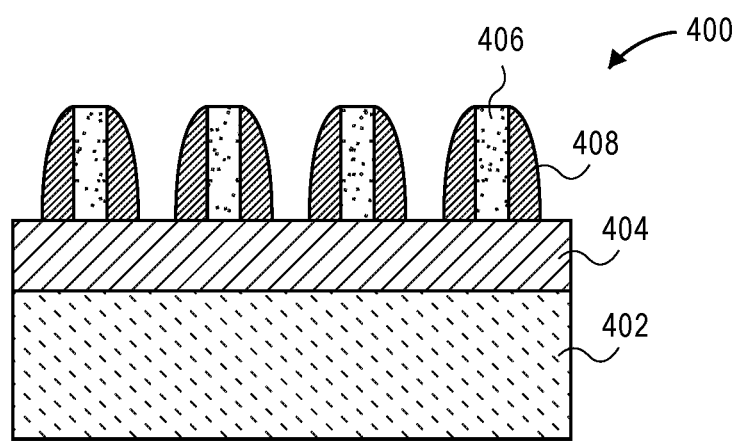
FIG. 4 illustrates a cross-sectional view of a starting structure following deposition, but prior to patterning, of a hardmask material layer formed on an interlayer dielectric (ILD) layer, in accordance with an embodiment of the present disclosure.
Figure 5:
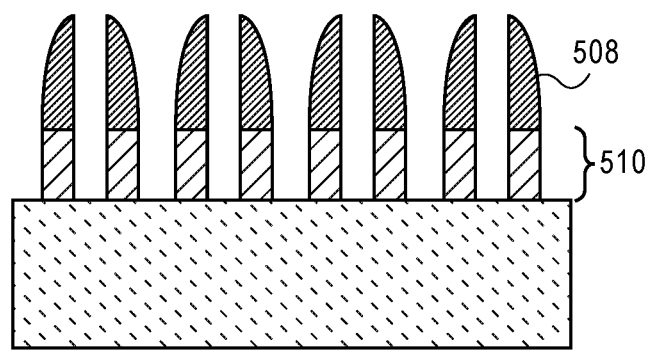
FIG. 5 illustrates a cross-sectional view of the structure of FIG. 4 following patterning of the hardmask layer by pitch halving, in accordance with an embodiment of the present disclosure.

In an embodiment, pitch division techniques are used to increase a line density. In a first example, pitch halving can be implemented to double the line density of a fabricated grating structure. FIG. 4 illustrates a cross-sectional view of a starting structure following deposition, but prior to patterning, of a hardmask material layer formed on an interlayer dielectric (ILD) layer. FIG. 5 illustrates a cross-sectional view of the structure of FIG. 4 following patterning of the hardmask layer by pitch halving.

Referring to FIG. 4, a starting structure 400 has a hardmask material layer 404 formed on an interlayer dielectric (ILD) layer 402. A patterned mask 406 is disposed above the hardmask material layer 404. The patterned mask 406 has spacers 408 formed along sidewalls of features (lines) thereof, on the hardmask material layer 404.

Referring to FIG. 5, the hardmask material layer 404 is patterned in a pitch halving approach. Specifically, the patterned mask 406 is first removed. The resulting pattern of the spacers 408 has double the density, or half the pitch or the features of the mask 406. The pattern of the spacers 408 is transferred, e.g., by an etch process, to the hardmask material layer 404 to form a patterned hardmask 410, as is depicted in FIG. 5. In one such embodiment, the patterned hardmask 410 is formed with a grating pattern having unidirectional lines. The grating pattern of the patterned hardmask 410 may be a tight pitch grating structure. For example, the tight pitch may not be achievable directly through conventional lithography techniques. Even further, although not shown, the original pitch may be quartered by a second round of spacer mask patterning. Accordingly, the grating-like pattern of the patterned hardmask 410 of FIG. 5 may have hardmask lines spaced at a constant pitch and having a constant width relative to one another. The dimensions achieved may be far smaller than the critical dimension of the lithographic technique employed. Accordingly, a blanket film may be patterned using lithography and etch processing which may involve, e.g., spacer-based-double-patterning (SBDP) or pitch halving, or spacer-based-quadruple-patterning (SBQP) or pitch quartering.

Figure 6:
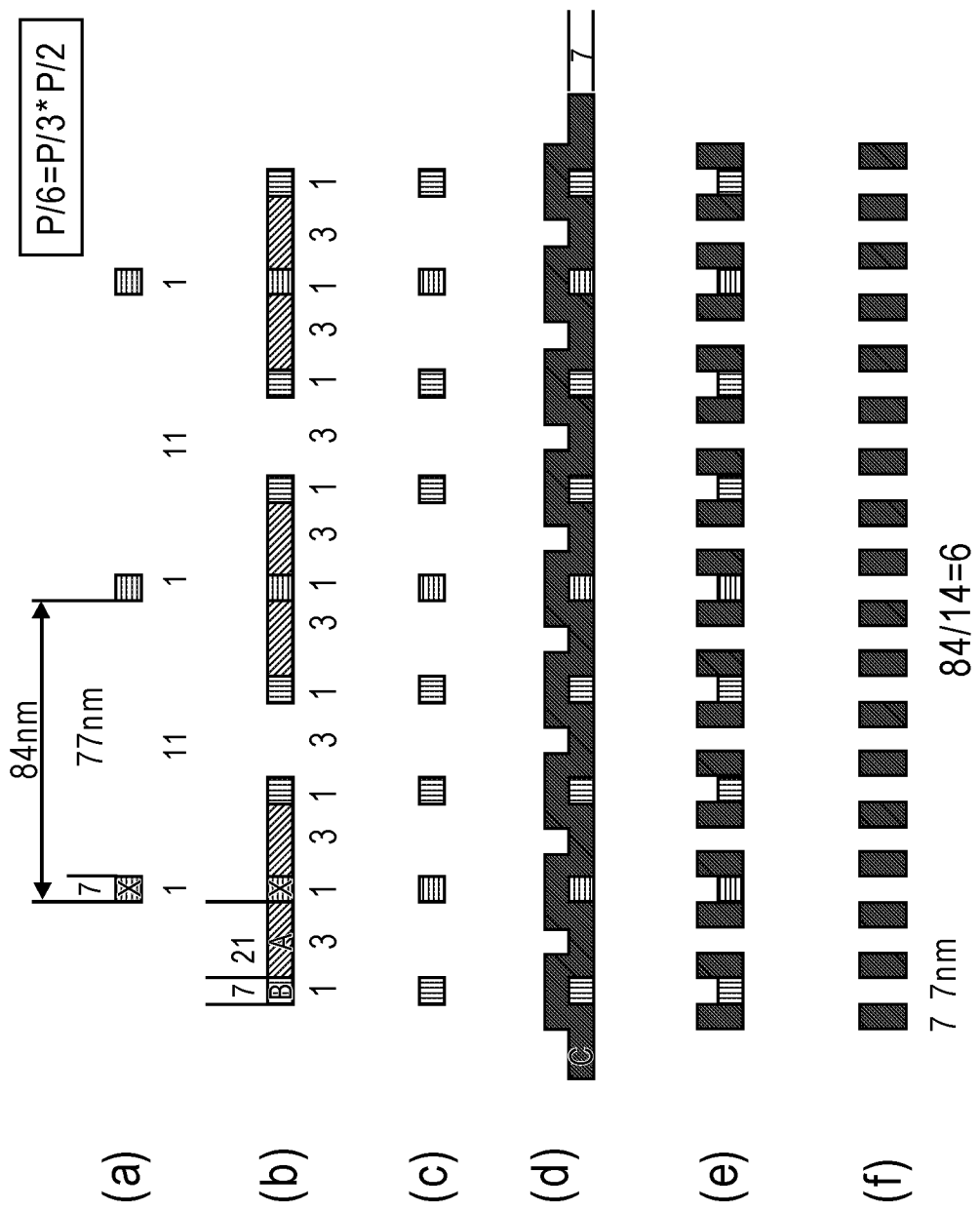
FIG. 6 illustrates cross-sectional views in a spacer-based-sextuple-patterning (SBSP) processing scheme which involves pitch division by a factor of six, in accordance with an embodiment of the present disclosure.

It is to be appreciated that other pitch division approaches may also be implemented. For example, FIG. 6 illustrates cross-sectional views in a spacer-based-sextuple-patterning (SBSP) processing scheme which involves pitch division by a factor of six. Referring to FIG. 6, at operation (a), a sacrificial pattern X is shown following litho, slim and etch processing. At operation (b), spacers A and B are shown following deposition and etching. At operation (c), the pattern of operation (b) is shown following spacer A removal. At operation (d), the pattern of operation (c) is shown following spacer C deposition. At operation (e), the pattern of operation (d) is shown following spacer C etch. At operation (f), a pitch/6 pattern is achieved following sacrificial pattern X removal and spacer B removal.

In an embodiment, lithographic operations are performed using 193 nm immersion litho (i193), EUV and/or EBDW lithography, or the like. A positive tone or a negative tone resist may be used. In one embodiment, a lithographic mask is a trilayer mask composed of a topographic masking portion, an anti-reflective coating (ARC) layer, and a photoresist layer. In a particular such embodiment, the topographic masking portion is a carbon hardmask (CHM) layer and the anti-reflective coating layer is a silicon ARC layer.

Figure 7A:
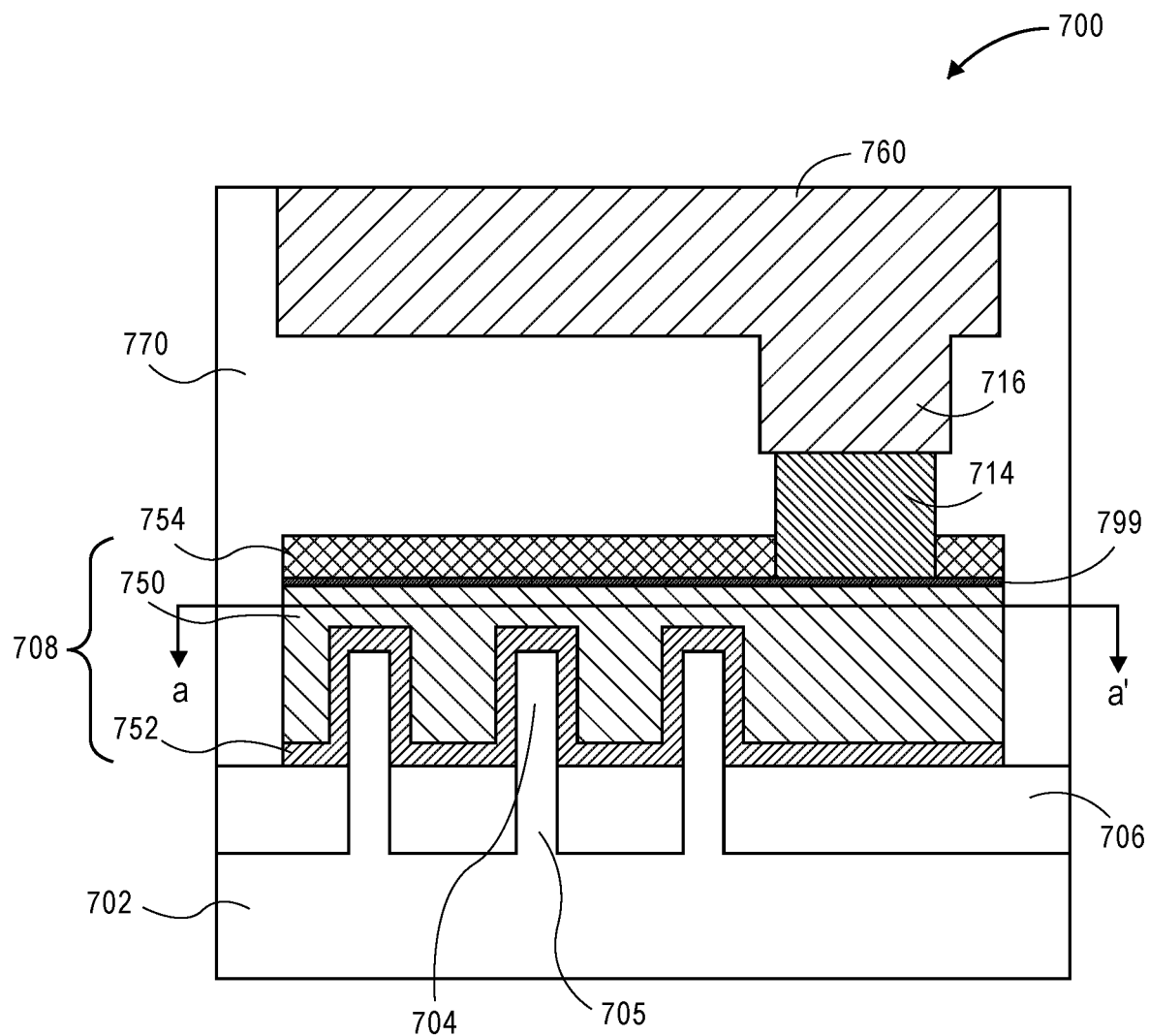
FIG. 7A illustrates a cross-sectional view of a non-planar semiconductor device having a self-aligned gate contact, in accordance with an embodiment of the present disclosure.
Figure 7B:
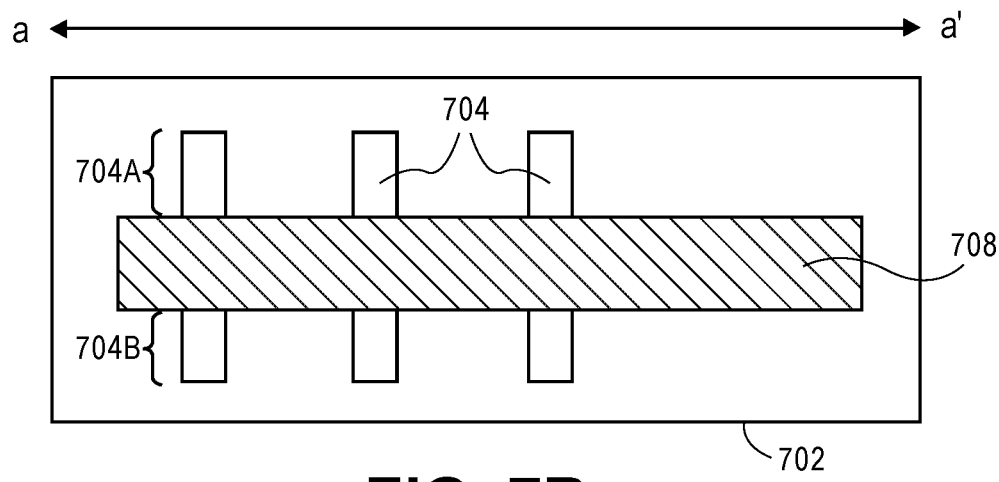
FIG. 7B illustrates a plan view taken along the a-a' axis of the semiconductor device of FIG. 7A, in accordance with an embodiment of the present disclosure.

In another aspect, one or more embodiments described herein are directed to fabricating semiconductor devices, such as for PMOS and NMOS device fabrication. For example, approaches described herein may be implemented to fabricate a self-aligned gate contact used in a metal oxide semiconductor (MOS) device. As an example of a completed device, FIG. 7A illustrates a cross-sectional view of a non-planar semiconductor device having a self-aligned gate contact, in accordance with an embodiment of the present disclosure. FIG. 7B illustrates a plan view taken along the a-a' axis of the semiconductor device of FIG. 7A, in accordance with an embodiment of the present disclosure.

Referring to FIG. 7A, a semiconductor structure or device 700 includes a non-planar active region (e.g., a fin structure including protruding fin portion 704 and sub-fin region 705) formed from substrate 702, and within isolation region 706. A gate line 708 is disposed over the protruding portions 704 of the non-planar active region as well as over a portion of the isolation region 706. As shown, gate line 708 includes a gate electrode 750 and a gate dielectric layer 752. In one embodiment, gate line 708 may also include a dielectric cap layer 754. A gate contact 714, and overlying gate contact via 716 are also seen from this perspective, along with an overlying metal interconnect 760, all of which are disposed in inter-layer dielectric stacks or layers 770. Also seen from the perspective of FIG. 7A, the gate contact 714 is, in one embodiment, disposed over isolation region 706, but not over the non-planar active regions. In accordance with an embodiment of the present disclosure, the dielectric cap layer 754 is a self-aligned or color hardmask layer, as described above. In one such embodiment, the dielectric cap layer 754 is formed on a conductive cap 799, such as conductive cap 114, and the gate contact 714 is formed thereon, in an opening formed in the dielectric cap layer 754.

Referring to FIG. 7B, the gate line 708 is shown as disposed over the protruding fin portions 704. Source and drain regions 704A and 704B of the protruding fin portions 704 can be seen from this perspective. In one embodiment, the source and drain regions 704A and 704B are doped portions of original material of the protruding fin portions 704. In another embodiment, the material of the protruding fin portions 704 is removed and replaced with another semiconductor material, e.g., by epitaxial deposition. In either case, the source and drain regions 704A and 704B may extend below the height of dielectric layer 706, i.e., into the sub-fin region 705.

In an embodiment, the semiconductor structure or device 700 is a non-planar device such as, but not limited to, a fin-FET or a tri-gate device. In such an embodiment, a corresponding semiconducting channel region is composed of or is formed in a three-dimensional body. In one such embodiment, the gate electrode stacks of gate lines 708 surround at least a top surface and a pair of sidewalls of the three-dimensional body.

Substrate 702 may be composed of a semiconductor material that can withstand a manufacturing process and in which charge can migrate. In an embodiment, substrate 702 is a bulk substrate composed of a crystalline silicon, silicon/germanium or germanium layer doped with a charge carrier, such as but not limited to phosphorus, arsenic, boron or a combination thereof, to form active region 704. In one embodiment, the concentration of silicon atoms in bulk substrate 702 is greater than 97%. In another embodiment, bulk substrate 702 is composed of an epitaxial layer grown atop a distinct crystalline substrate, e.g. a silicon epitaxial layer grown atop a boron-doped bulk silicon mono-crystalline substrate. Bulk substrate 702 may alternatively be composed of a group III-V material. In an embodiment, bulk substrate 702 is composed of a III-V material such as, but not limited to, gallium nitride, gallium phosphide, gallium arsenide, indium phosphide, indium antimonide, indium gallium arsenide, aluminum gallium arsenide, indium gallium phosphide, or a combination thereof. In one embodiment, bulk substrate 702 is composed of a III-V material and the charge-carrier dopant impurity atoms are ones such as, but not limited to, carbon, silicon, germanium, oxygen, sulfur, selenium or tellurium.

Isolation region 706 may be composed of a material suitable to ultimately electrically isolate, or contribute to the isolation of, portions of a permanent gate structure from an underlying bulk substrate or isolate active regions formed within an underlying bulk substrate, such as isolating fin active regions. For example, in one embodiment, the isolation region 706 is composed of a dielectric material such as, but not limited to, silicon dioxide, silicon oxy-nitride, silicon nitride, or carbon-doped silicon nitride.

Gate line 708 may be composed of a gate electrode stack which includes a gate dielectric layer 752 and a gate electrode layer 750. In an embodiment, the gate electrode 750 of the gate electrode stack is composed of a metal gate and the gate dielectric layer 752 is composed of a high-K material. For example, in one embodiment, the gate dielectric layer 752 is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. Furthermore, a portion of gate dielectric layer may include a layer of native oxide formed from the top few layers of the substrate 702. In an embodiment, the gate dielectric layer is composed of a top high-k portion and a lower portion composed of an oxide of a semiconductor material. In one embodiment, the gate dielectric layer 752 is composed of a top portion of hafnium oxide and a bottom portion of silicon dioxide or silicon oxy-nitride.

In an embodiment, the gate electrode layer 750 of gate line 708 is composed of a metal layer such as, but not limited to, metal nitrides, metal carbides, metal silicides, metal aluminides, hafnium, zirconium, titanium, tantalum, aluminum, ruthenium, palladium, platinum, cobalt, nickel or conductive metal oxides. In a specific embodiment, the gate electrode is composed of a non-workfunction-setting fill material formed above a metal workfunction-setting layer. The gate electrode layer may consist of a P-type workfunction metal or an N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a conductive fill layer. For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV. In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers. In an embodiment, conductive cap 799 is composed of a material such as described above in association with conductive caps 114, 114A and 114B. In an embodiment, the dielectric cap layer 754 is composed of a material such as described above in association with hardmask components 118, 120, 218 or 220.

Spacers associated with the gate electrode stacks may be composed of a material suitable to ultimately electrically isolate, or contribute to the isolation of, a permanent gate structure from adjacent conductive contacts, such as self-aligned contacts. For example, in one embodiment, the spacers are composed of a dielectric material such as, but not limited to, silicon dioxide, silicon oxy-nitride, silicon nitride, or carbon-doped silicon nitride.

Gate contact 714 and overlying gate contact via 716 may be composed of a conductive material. In an embodiment, one or more of the contacts or vias are composed of a metal species. The metal species may be a pure metal, such as tungsten, nickel, or cobalt, or may be an alloy such as a metal-metal alloy or a metal-semiconductor alloy (e.g., such as a silicide material). In accordance with another embodiment of the present disclosure, the gate contact 714 is a self-aligned gate contact.

In an embodiment (although not shown), providing structure 700 involves formation of a contact pattern which is essentially perfectly aligned to an existing gate pattern while eliminating the use of a lithographic step with exceedingly tight registration budget. In one such embodiment, this approach enables the use of intrinsically highly selective wet etching (e.g., versus conventionally implemented dry or plasma etching) to generate contact openings. In an embodiment, a contact pattern is formed by utilizing an existing gate pattern in combination with a contact plug lithography operation. In one such embodiment, the approach enables elimination of the need for an otherwise critical lithography operation to generate a contact pattern, as used in conventional approaches. In an embodiment, a trench contact grid is not separately patterned, but is rather formed between poly (gate) lines. For example, in one such embodiment, a trench contact grid is formed subsequent to gate grating patterning but prior to gate grating cuts.

Furthermore, the gate stack structure 708 may be fabricated by a replacement gate process. In such a scheme, dummy gate material such as polysilicon or silicon nitride pillar material, may be removed and replaced with permanent gate electrode material. In one such embodiment, a permanent gate dielectric layer is also formed in this process, as opposed to being carried through from earlier processing. In an embodiment, dummy gates are removed by a dry etch or wet etch process. In one embodiment, dummy gates are composed of polycrystalline silicon or amorphous silicon and are removed with a dry etch process including use of $SF_6$. In another embodiment, dummy gates are composed of polycrystalline silicon or amorphous silicon and are removed with a wet etch process including use of aqueous $NH_4OH$ or tetramethylammonium hydroxide. In one embodiment, dummy gates are composed of silicon nitride and are removed with a wet etch including aqueous phosphoric acid.

In an embodiment, one or more approaches described herein contemplate essentially a dummy and replacement gate process in combination with a dummy and replacement contact process to arrive at structure 700. In one such embodiment, the replacement contact process is performed after the replacement gate process to allow high temperature anneal of at least a portion of the permanent gate stack. For example, in a specific such embodiment, an anneal of at least a portion of the permanent gate structures, e.g., after a gate dielectric layer is formed, is performed at a temperature greater than approximately 600 degrees Celsius. The anneal is performed prior to formation of the permanent contacts.

Referring again to FIG. 7A, the arrangement of semiconductor structure or device 700 places the gate contact over isolation regions. Such an arrangement may be viewed as inefficient use of layout space. In another embodiment, however, a semiconductor device has contact structures that contact portions of a gate electrode formed over an active region. In general, prior to (e.g., in addition to) forming a gate contact structure (such as a via) over an active portion of a gate and in a same layer as a trench contact via, one or more embodiments of the present disclosure include first using a gate aligned trench contact process. Such a process may be implemented to form trench contact structures for semiconductor structure fabrication, e.g., for integrated circuit fabrication. In an embodiment, a trench contact pattern is formed as aligned to an existing gate pattern. By contrast, conventional approaches typically involve an additional lithography process with tight registration of a lithographic contact pattern to an existing gate pattern in combination with selective contact etches. For example, a conventional process may include patterning of a poly (gate) grid with separate patterning of contact features.

It is to be appreciated that not all aspects of the processes described above need be practiced to fall within the spirit and scope of embodiments of the present disclosure. For example, in one embodiment, dummy gates need not ever be formed prior to fabricating gate contacts over active portions of the gate stacks. The gate stacks described above may actually be permanent gate stacks as initially formed. Also, the processes described herein may be used to fabricate one or a plurality of semiconductor devices. The semiconductor devices may be transistors or like devices. For example, in an embodiment, the semiconductor devices are a metal-oxide semiconductor (MOS) transistors for logic or memory, or are bipolar transistors. Also, in an embodiment, the semiconductor devices have a three-dimensional architecture, such as a trigate device, an independently accessed double gate device, or a FIN-FET. One or more embodiments may be particularly useful for fabricating semiconductor devices at a 10 nanometer (10 nm) or smaller technology node.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 8:
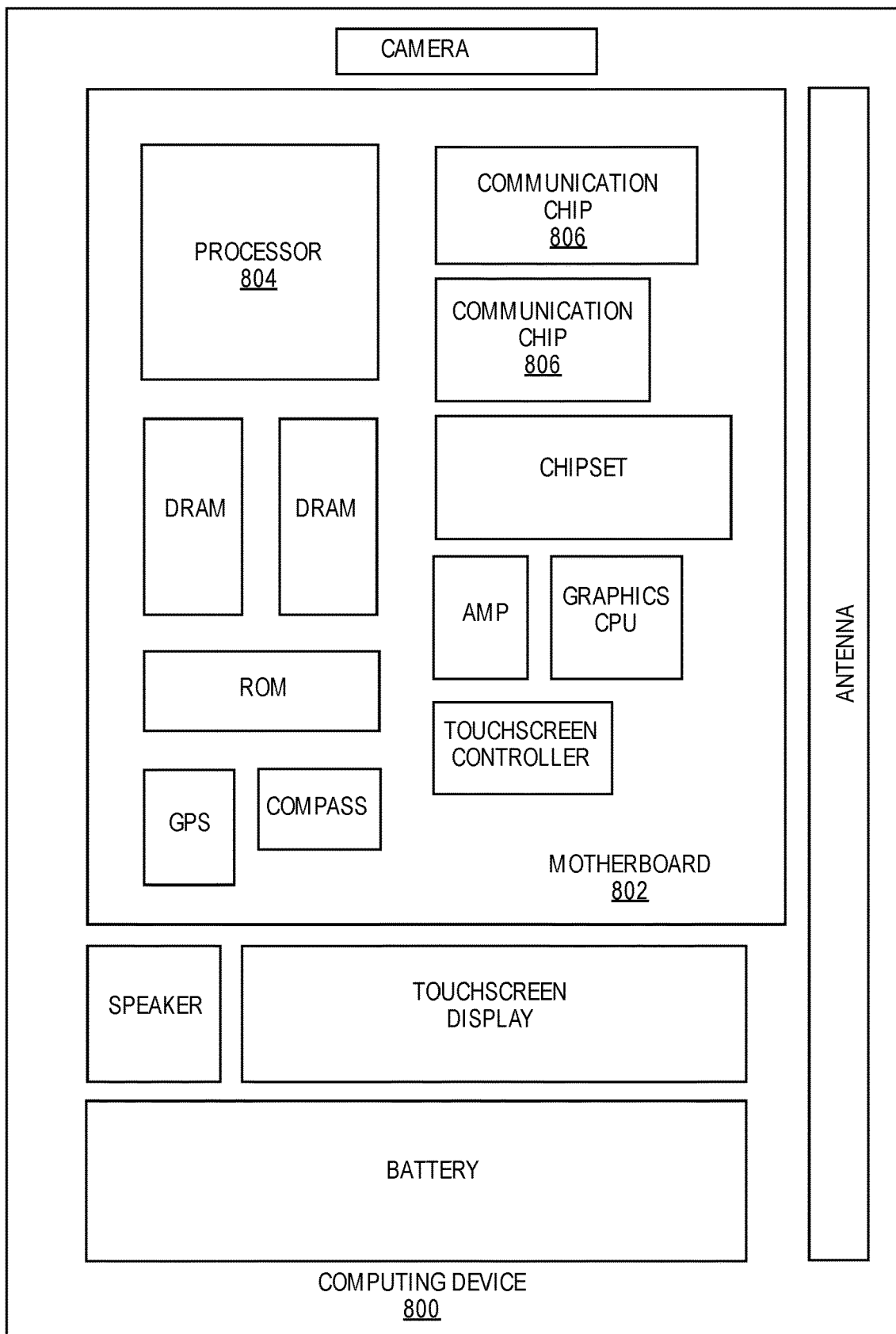
FIG. 8 illustrates a computing device in accordance with one implementation of an embodiment of the present disclosure.

FIG. 8 illustrates a computing device 800 in accordance with one implementation of the disclosure. The computing device 800 houses a board 802. The board 802 may include a number of components, including but not limited to a processor 804 and at least one communication chip 806. The processor 804 is physically and electrically coupled to the board 802. In some implementations the at least one communication chip 806 is also physically and electrically coupled to the board 802. In further implementations, the communication chip 806 is part of the processor 804.

Depending on its applications, computing device 800 may include other components that may or may not be physically and electrically coupled to the board 802. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 806 enables wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 806 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 800 may include a plurality of communication chips 806. For instance, a first communication chip 806 may be dedicated to shorter range wireless communications such as Wi-Fi and Bluetooth and a second communication chip 806 may be dedicated to longer range wireless communications such as GPS, EDGE, GPRS, CDMA, WiMAX, LTE, Ev-DO, and others.

The processor 804 of the computing device 800 includes an integrated circuit die packaged within the processor 804. In some implementations of the disclosure, the integrated circuit die of the processor includes one or more structures, such as conductive caps and corresponding conductive vias, built in accordance with implementations of embodiments of the disclosure. The term "processor" may refer to any device or portion of a device that processes electronic data from registers and/or memory to transform that electronic data into other electronic data that may be stored in registers and/or memory.

The communication chip 806 also includes an integrated circuit die packaged within the communication chip 806. In accordance with another implementation of the disclosure, the integrated circuit die of the communication chip includes one or more structures, such as conductive caps and corresponding conductive vias, built in accordance with implementations of embodiments of the disclosure.

In further implementations, another component housed within the computing device 800 may contain an integrated circuit die that includes one or more structures, such as conductive caps and corresponding conductive vias, built in accordance with implementations of embodiments of the disclosure.

In various implementations, the computing device 800 may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device 800 may be any other electronic device that processes data.

Figure 9:
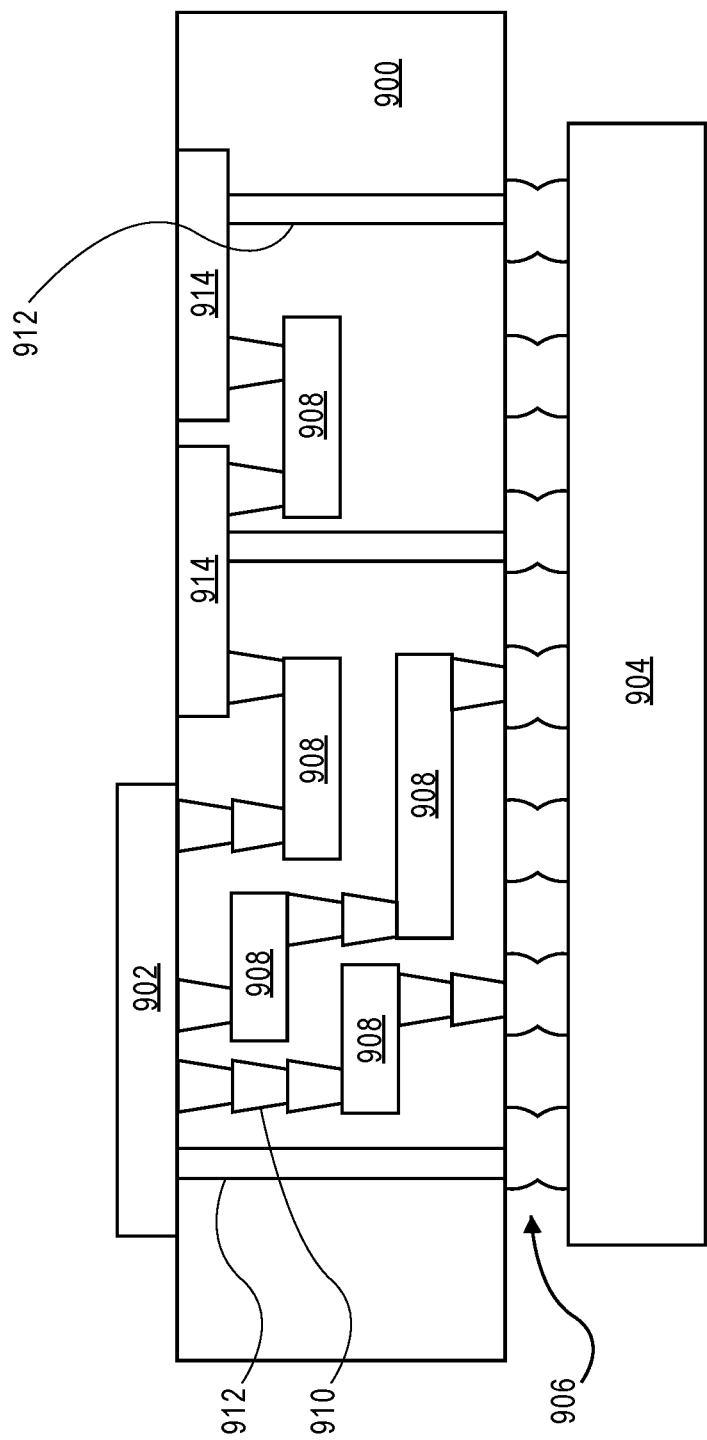
FIG. 9 is an interposer implementing one or more embodiments of the disclosure.

FIG. 9 illustrates an interposer 900 that includes one or more embodiments of the disclosure. The interposer 900 is an intervening substrate used to bridge a first substrate 902 to a second substrate 904. The first substrate 902 may be, for instance, an integrated circuit die. The second substrate 904 may be, for instance, a memory module, a computer motherboard, or another integrated circuit die. Generally, the purpose of an interposer 900 is to spread a connection to a wider pitch or to reroute a connection to a different connection. For example, an interposer 900 may couple an integrated circuit die to a ball grid array (BGA) 906 that can subsequently be coupled to the second substrate 904. In some embodiments, the first and second substrates 902/904 are attached to opposing sides of the interposer 900. In other embodiments, the first and second substrates 902/904 are attached to the same side of the interposer 900. And in further embodiments, three or more substrates are interconnected by way of the interposer 900.

The interposer 900 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group II-V and group IV materials.

The interposer may include metal interconnects 908 and vias 910, including but not limited to through-silicon vias (TSVs) 912. The interposer 900 may further include embedded devices 914, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 900. In accordance with embodiments of the disclosure, apparatuses or processes disclosed herein may be used in the fabrication of interposer 900.

Thus, embodiments of the present disclosure include conductive cap-based approaches for conductive via fabrication, and the resulting structures.

Example Embodiment 1

An integrated circuit structure includes a plurality of conductive lines in an inter-layer dielectric (ILD) layer above a substrate. Each of the plurality of conductive lines is recessed relative to an uppermost surface of the ILD layer. A plurality of conductive caps is on corresponding ones of the plurality of conductive lines, in recess regions above each of the plurality of conductive lines. A hardmask layer is on the plurality of conductive caps and on the uppermost surface of the ILD layer. The hardmask layer includes a first hardmask component on and aligned with the plurality of conductive caps, and a second hardmask component on an aligned with regions of the uppermost surface of the ILD layer. The first and second hardmask components differ in composition from one another. A conductive via is in an opening in the hardmask layer and on a conductive cap of one of the plurality of conductive lines. A portion of the conductive via is on a portion of the second hardmask component of the hardmask layer.

Example Embodiment 2

The integrated circuit structure of example embodiment 1, wherein the plurality of conductive caps has an uppermost surface substantially co-planar with the uppermost surface of the ILD layer.

Example Embodiment 3

The integrated circuit structure of example embodiment 1 or 2, wherein the first hardmask component has an uppermost surface substantially co-planar with an uppermost surface of the second hardmask component.

Example Embodiment 4

The integrated circuit structure of example embodiment 1, 2 or 3, further including a second ILD layer above the hardmask layer, wherein the conductive via is further in an opening of the second ILD layer.

Example Embodiment 5

The integrated circuit structure of example embodiment 4, wherein the opening of the second ILD layer has a width approximately equal to ¾ pitch of the plurality of conductive lines.

Example Embodiment 6

The integrated circuit structure of example embodiment 1, 2, 3, 4 or 5, wherein one of the plurality of conductive lines is coupled to an underlying conductive via structure, the underlying conductive via structure connected to an underlying metallization layer of the integrated circuit structure.

Example Embodiment 7

An integrated circuit structure includes a plurality of alternating first and second conductive lines along a same direction of a back end of line (BEOL) metallization layer in an inter-layer dielectric (ILD) layer above a substrate. Each of the plurality of alternating first and second conductive lines is recessed relative to an uppermost surface of the ILD layer. A plurality of first conductive caps is on corresponding ones of the first conductive lines, in recess regions above each of the first conductive lines. A plurality of second conductive caps is on corresponding ones of the second conductive lines, in recess regions above each of the second conductive lines. The plurality of second conductive caps differs in composition from the plurality of first conductive caps. A hardmask layer is on the plurality of first conductive caps, on the plurality of second conductive caps and on the uppermost surface of the ILD layer. The hardmask layer includes a first hardmask component on and aligned with the plurality of first conductive caps, and a second hardmask component on an aligned with the plurality of second conductive caps. The first and second hardmask components differ in composition from one another. A conductive via is in an opening in the hardmask layer and on a second conductive cap of one of the second conductive lines. A portion of the conductive via is on a portion of the first hardmask component of the hardmask layer.

Example Embodiment 8

The integrated circuit structure of example embodiment 7, wherein the plurality of first conductive caps and the plurality of second conductive caps have an uppermost surface substantially co-planar with the uppermost surface of the ILD layer.

Example Embodiment 9

The integrated circuit structure of example embodiment 7 or 8, wherein the first hardmask component has an uppermost surface substantially co-planar with an uppermost surface of the second hardmask component.

Example Embodiment 10

The integrated circuit structure of example embodiment 7, 8 or 9, further including a second ILD layer above the hardmask layer. The conductive via is further in an opening of the second ILD layer.

Example Embodiment 11

The integrated circuit structure of example embodiment 10, wherein the opening of the second ILD layer has a width approximately equal to 1.5 pitch of the plurality of alternating first and second conductive lines.

Example Embodiment 12

The integrated circuit structure of example embodiment 7, 8, 9, 10 or 11, wherein one of the plurality of alternating first and second conductive lines is coupled to an underlying conductive via structure, the underlying conductive via structure connected to an underlying metallization layer of the integrated circuit structure.

Example Embodiment 13

The integrated circuit structure of example embodiment 7, 8, 9, 10, 11 or 12, wherein a total composition of the first conductive lines is the same as a total composition of the second conductive lines.

Example Embodiment 14

The integrated circuit structure of example embodiment 7, 8, 9, 10, 11 or 12, wherein a total composition of the first conductive lines is 25 different than a total composition of the second conductive lines.

Example Embodiment 15

A method of fabricating a back end of line (BEOL) metallization layer includes forming a plurality of conductive lines in an inter-layer dielectric (ILD) layer above a substrate. The method also includes recessing the plurality of conductive lines relative to an uppermost surface of the ILD layer. The method also includes, subsequent to the recessing, forming a plurality of conductive caps on corresponding ones of the plurality of conductive lines, in recess regions above each of the plurality of conductive lines. The method also includes forming a hardmask layer on the plurality of conductive caps and on the uppermost surface of the ILD layer. The hardmask layer includes a first hardmask component on and aligned with the plurality of conductive caps, and a second hardmask component on an aligned with regions of the uppermost surface of the ILD layer. The first and second hardmask components differ in composition from one another. The method also includes forming an opening in the hardmask layer by removing a portion of the first hardmask component from over a conductive cap of one of the plurality of conductive lines. The method also includes forming a conductive via in the opening in the hardmask layer and on the conductive cap of the one of the plurality of conductive lines.

Example Embodiment 16

The method of example embodiment 15, further including using a directed self-assembly (DSA) approach to form the first hardmask component over the plurality of conductive caps but not over the uppermost surface of the ILD layer, and to form the a second hardmask component over the uppermost surface of the ILD layer but not over the plurality of conductive caps, wherein the first and second hardmask components differ in etch selectivity.

Example Embodiment 17

The method of example embodiment 15, further including using a selective growth approach to form the first hardmask component over the plurality of conductive caps but not over the uppermost surface of the ILD layer, and to form second hardmask component over the uppermost surface of the ILD layer but not over the plurality of conductive caps, wherein the first and second hardmask components differ in etch selectivity.

Example Embodiment 18

The method of example embodiment 15, 16 or 17, wherein forming the plurality of conductive lines includes using a pitch division patterning process.

Example Embodiment 19

The method of example embodiment 15, 16, 17 or 18, wherein a portion of the conductive via is formed on a portion of the second hardmask component of the hardmask layer.

Example Embodiment 20

A method of fabricating a back end of line (BEOL) metallization layer includes forming a plurality of alternating first and second conductive lines in an inter-layer dielectric (ILD) layer above a substrate. The method also includes recessing the plurality of alternating first and second conductive lines relative to an uppermost surface of the ILD layer. The method also includes, subsequent to the recessing, forming a plurality of first conductive caps on corresponding ones of the first conductive lines in recess regions above each of the first conductive lines, and forming a plurality of second conductive caps on corresponding ones of the second conductive lines in recess regions above each of the second conductive lines. The plurality of second conductive caps differs in composition from the plurality of first conductive caps. The method also includes forming a hardmask layer on the plurality of first conductive caps, on the plurality of second conductive caps and on the uppermost surface of the ILD layer. The hardmask layer includes a first hardmask component on and aligned with the plurality of first conductive caps, and a second hardmask component on an aligned with the plurality of second conductive caps. The first and second hardmask components differ in composition from one another. The method also includes forming an opening in the hardmask layer by removing a portion of the second hardmask component from over a second conductive cap of one of the second conductive lines. The method also includes forming a conductive via in the opening in the hardmask layer and on the second conductive cap of the one of the plurality of second conductive lines.

Example Embodiment 21

The method of example embodiment 20, further including using a directed self-assembly (DSA) approach to form the first hardmask component over the plurality of first conductive caps but not over the plurality of second conductive caps, and to form the second hardmask component over the plurality of second conductive caps but not over the plurality of first conductive caps, wherein the first and second hardmask components differ in etch selectivity.

Example Embodiment 22

The method of example embodiment 20, further including using a selective growth approach to form the first hardmask component over the plurality of first conductive caps but not over the plurality of second conductive caps, and to form the second hardmask component over the plurality of second conductive caps but not over the plurality of first conductive caps, wherein the first and second hardmask components differ in etch selectivity.

Example Embodiment 23

The method of example embodiment 20, 21 or 22, wherein forming the plurality of alternating first and second conductive lines includes using a pitch division patterning process.

Example Embodiment 24

The method of example embodiment 20, 21, 22 or 23, wherein a portion of the conductive via is formed on a portion of the first hardmask component of the hardmask layer.

What is claimed is:
1. An integrated circuit structure, comprising:
   a plurality of conductive lines in an inter-layer dielectric (ILD) layer above a substrate, wherein the plurality of conductive lines is recessed relative to an uppermost surface of the ILD layer, and wherein no additional conductive lines are intervening between adjacent ones of the plurality of conductive lines;
   a plurality of conductive caps, ones of the plurality of conductive caps on corresponding ones of the plurality of conductive lines and in corresponding ones of a plurality of recess regions above the corresponding ones of the plurality of conductive lines;
   a hardmask layer on the plurality of conductive caps and on the uppermost surface of the ILD layer, the hardmask layer comprising a first hardmask component on and aligned with the plurality of conductive caps, and a second hardmask component on an aligned with regions of the uppermost surface of the ILD layer, the first and second hardmask components differing in composition from one another, wherein the first hardmask component is on all conductive caps of the plurality of conductive caps, and wherein the first hardmask component is vertically over all conductive lines of the plurality of conductive lines; and
   a conductive via in an opening in the hardmask layer and on a conductive cap of one of the plurality of conductive lines, wherein a portion of the conductive via is on a portion of the second hardmask component of the hardmask layer.

2. The integrated circuit structure of claim 1, wherein the plurality of conductive caps has an uppermost surface substantially co-planar with the uppermost surface of the ILD layer.

3. The integrated circuit structure of claim 1, wherein the first hardmask component has an uppermost surface substantially co-planar with an uppermost surface of the second hardmask component.

4. The integrated circuit structure of claim 1, further comprising:
   a second ILD layer above the hardmask layer, wherein the conductive via is further in an opening of the second ILD layer.

5. The integrated circuit structure of claim 4, wherein the opening of the second ILD layer has a width approximately equal to/pitch of the plurality of conductive lines.

6. An integrated circuit structure, comprising:
   a plurality of alternating first and second conductive lines along a same direction of a back end of line (BEOL) metallization layer in an inter-layer dielectric (ILD) layer above a substrate, wherein each of the plurality of alternating first and second conductive lines is recessed relative to an uppermost surface of the ILD layer;

a plurality of first conductive caps on corresponding ones of the first conductive lines, in recess regions above each of the first conductive lines;

a plurality of second conductive caps on corresponding ones of the second conductive lines, in recess regions above each of the second conductive lines, the plurality of second conductive caps differing in composition from the plurality of first conductive caps;

a hardmask layer on the plurality of first conductive caps, on the plurality of second conductive caps and on the uppermost surface of the ILD layer, the hardmask layer comprising a first hardmask component on and aligned with the plurality of first conductive caps, and a second hardmask component on an aligned with the plurality of second conductive caps, the first and second hardmask components differing in composition from one another; and a conductive via in an opening in the hardmask layer and on a second conductive cap of one of the second conductive lines, wherein a portion of the conductive via is on a portion of the first hardmask component of the hardmask layer.

7. The integrated circuit structure of claim 6, wherein the plurality of first conductive caps and the plurality of second conductive caps have an uppermost surface substantially co-planar with the uppermost surface of the ILD layer.

8. The integrated circuit structure of claim 6, wherein the first hardmask component has an uppermost surface substantially co-planar with an uppermost surface of the second hardmask component.

9. The integrated circuit structure of claim 6, further comprising: a second ILD layer above the hardmask layer, wherein the conductive via is further in an opening of the second ILD layer.

10. The integrated circuit structure of claim 9, wherein the opening of the second ILD layer has a width approximately equal to 1.5 pitch of the plurality of alternating first and second conductive lines.

11. The integrated circuit structure of claim 6, wherein one of the plurality of alternating first and second conductive lines is coupled to an underlying conductive via structure, the underlying conductive via structure connected to an underlying metallization layer of the integrated circuit structure.

12. The integrated circuit structure of claim 6, wherein a total composition of the first conductive lines is the same as a total composition of the second conductive lines.

13. The integrated circuit structure of claim 6, wherein a total composition of the first conductive lines is different than a total composition of the second conductive lines.

14. A method of fabricating a back end of line (BEOL) metallization layer, the method comprising:

forming a plurality of conductive lines in an inter-layer dielectric (ILD) layer above a substrate, wherein no additional conductive lines are intervening between adjacent ones of the plurality of conductive lines;

recessing the plurality of conductive lines relative to an uppermost surface of the ILD layer to form a plurality of recess regions;

subsequent to the recessing, forming a plurality of conductive caps, ones of the plurality of conductive caps on corresponding ones of the plurality of conductive lines and in corresponding ones of the plurality of recess regions above each of the corresponding ones of the plurality of conductive lines;

forming a hardmask layer on the plurality of conductive caps and on the uppermost surface of the ILD layer, the hardmask layer comprising a first hardmask component on and aligned with the plurality of conductive caps, and a second hardmask component on an aligned with regions of the uppermost surface of the ILD layer, the first and second hardmask components differing in composition from one another, wherein the first hardmask component is on all conductive caps of the plurality of conductive caps, and wherein the first hardmask component is vertically over all conductive lines of the plurality of conductive lines;

forming an opening in the hardmask layer by removing a portion of the first hardmask component from over a conductive cap of one of the plurality of conductive lines; and forming a conductive via in the opening in the hardmask layer and on the conductive cap of the one of the plurality of conductive lines.

15. The method of claim 14, further comprising using a directed self-assembly (DSA) approach to form the first hardmask component over the plurality of conductive caps but not over the uppermost surface of the ILD layer, and to form the second hardmask component over the uppermost surface of the ILD layer but not over the plurality of conductive caps, wherein the first and second hardmask components differ in etch selectivity.

16. The method of claim 14, further comprising using a selective growth approach to form the first hardmask component over the plurality of conductive caps but not over the uppermost surface of the ILD layer, and to form the second hardmask component over the uppermost surface of the ILD layer but not over the plurality of conductive caps, wherein the first and second hardmask components differ in etch selectivity.

17. The method of claim 14, wherein forming the plurality of conductive lines comprises using a pitch division patterning process.

18. The method of claim 14, wherein a portion of the conductive via is formed on a portion of the second hardmask component of the hardmask layer.

19. A method of fabricating a back end of line (BEOL) metallization layer, the method comprising:

forming a plurality of alternating first and second conductive lines in an inter-layer dielectric (ILD) layer above a substrate;

recessing the plurality of alternating first and second conductive lines relative to an uppermost surface of the ILD layer; subsequent to the recessing, forming a plurality of first conductive caps on corresponding ones of the first conductive lines in recess regions above each of the first conductive lines, and forming a plurality of second conductive caps on corresponding ones of the second conductive lines in recess regions above each of the second conductive lines, the plurality of second conductive caps differing in composition from the plurality of first conductive caps;

forming a hardmask layer on the plurality of first conductive caps, on the plurality of second conductive caps and on the uppermost surface of the ILD layer, the hardmask layer comprising a first hardmask component on and aligned with the plurality of first conductive caps, and a second hardmask component on an aligned with the plurality of second conductive caps, the first and second hardmask components differing in composition from one another;

forming an opening in the hardmask layer by removing a portion of the second hardmask component from over a second conductive cap of one of the second conductive lines; and forming a conductive via in the opening in the hardmask layer and on the second conductive cap of the one of the plurality of second conductive lines.

20. The method of claim 19, further comprising using a directed self-assembly (DSA) approach to form the first hardmask component over the plurality of first conductive caps but not over the plurality of second conductive caps, and to form the second hardmask component over the plurality of second conductive caps but not over the plurality of first conductive caps, wherein the first and second hardmask components differ in etch selectivity.

21. The method of claim 19, further comprising using a selective growth approach to form the first hardmask component over the plurality of first conductive caps but not over the plurality of second conductive caps, and to form the second hardmask component over the plurality of second conductive caps but not over the plurality of first conductive caps, wherein the first and second hardmask components differ in etch selectivity.

22. The method of claim 19, wherein forming the plurality of alternating first and second conductive lines comprises using a pitch division patterning process.

23. The method of claim 19, wherein a portion of the conductive via is formed on a portion of the first hardmask component of the hardmask layer.

* * * * *